(12) United States Patent
Wu et al.

(10) Patent No.: US 12,048,148 B2
(45) Date of Patent: Jul. 23, 2024

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Linchun Wu, Wuhan (CN); Kun Zhang, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 832 days.

(21) Appl. No.: 17/084,401

(22) Filed: Oct. 29, 2020

(65) Prior Publication Data
US 2021/0320115 A1    Oct. 14, 2021

Related U.S. Application Data

(63) Continuation of application No. PCT/CN2020/113464, filed on Sep. 4, 2020.

(30) Foreign Application Priority Data

Apr. 14, 2020   (WO) ................ PCT/CN2020/084600
Apr. 14, 2020   (WO) ................ PCT/CN2020/084603
(Continued)

(51) Int. Cl.
*H10B 41/27*    (2023.01)
*H10B 41/10*    (2023.01)
(Continued)

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/27; H10B 41/10; H10B 41/35; H10B 43/10; H10B 43/27; H10B 43/35
See application file for complete search history.

(56) References Cited

U.S. PATENT DOCUMENTS 9,824,966 B1    11/2017 Kanakamedala et al.
10,553,599 B1    2/2020 Chen et al.
(Continued)

FOREIGN PATENT DOCUMENTS

CN    107425005 A    12/2017
CN    110945657 A    1/2019
(Continued)

*Primary Examiner* — Douglas W Owens
(74) *Attorney, Agent, or Firm* — BAYES PLLC

(57) ABSTRACT

Embodiments of 3D memory devices and methods for forming the same are disclosed. In an example, a 3D memory device includes an insulating layer, a semiconductor layer, a memory stack including interleaved conductive layers and dielectric layers, a source contact structure extending vertically through the insulating layer from an opposite side of the insulating layer with respect to the semiconductor layer to be in contact with the semiconductor layer, and a channel structure extending vertically through the memory stack and the semiconductor layer into the insulating layer or the source contact structure.

20 Claims, 12 Drawing Sheets

(30) Foreign Application Priority Data

| Apr. 27, 2020 | (WO) | ................ PCT/CN2020/087295 |
| Apr. 27, 2020 | (WO) | ................ PCT/CN2020/087296 |
| May 27, 2020 | (WO) | ................ PCT/CN2020/092512 |
| May 27, 2020 | (WO) | ................ PCT/CN2020/092513 |

(51) Int. Cl.
    *H10B 41/35*     (2023.01)
    *H10B 43/10*     (2023.01)
    *H10B 43/27*     (2023.01)
    *H10B 43/35*     (2023.01)

(56) References Cited

U.S. PATENT DOCUMENTS

| 2015/0318298 A1 | 11/2015 | Matsudaira et al. | |
| 2015/0372000 A1 | 12/2015 | Jee et al. | |
| 2017/0148810 A1 | 5/2017 | Kai et al. | |
| 2019/0296032 A1 | 9/2019 | Noda | |
| 2019/0305096 A1 | 10/2019 | Choi | |
| 2021/0159244 A1* | 5/2021 | Xia | ........................ H10B 43/50 |
| 2021/0320120 A1* | 10/2021 | Wu | ........................ H10B 43/35 |

FOREIGN PATENT DOCUMENTS

| CN | 109786387 A | 5/2019 |
| CN | 110034124 A | 7/2019 |
| CN | 110062958 A | 7/2019 |
| CN | 110349968 A | 10/2019 |
| CN | 110785851 A | 2/2020 |
| CN | 110808252 A | 2/2020 |
| TW | 201640652 A | 11/2016 |

\* cited by examiner

300

THREE-DIMENSIONAL MEMORY DEVICES AND METHODS FOR FORMING THE SAME

CROSS-REFERENCE TO RELATED APPLICATIONS

This application is continuation of International Application No. PCT/CN2020/113464, filed on Sep. 4, 2020, entitled "THREE-DIMENSIONAL MEMORY DEVICES AND METHODS FOR FORMING THE SAME," which is hereby incorporated by reference in its entirety. This application also claims the benefit of priorities to International Application No. PCT/CN2020/084600, filed on Apr. 14, 2020, entitled "THREE-DIMENSIONAL MEMORY DEVICE WITH BACKSIDE SOURCE CONTACT," International Application No. PCT/CN2020/084603, filed on Apr. 14, 2020, entitled "METHOD FOR FORMING THREE-DIMENSIONAL MEMORY DEVICE WITH BACKSIDE SOURCE CONTACT," International Application No. PCT/CN2020/087295, filed on Apr. 27, 2020, entitled "THREE-DIMENSIONAL MEMORY DEVICE AND METHOD FOR FORMING THE SAME," International Application No. PCT/CN2020/087296, filed on Apr. 27, 2020, entitled "THREE-DIMENSIONAL MEMORY DEVICE AND METHOD FOR FORMING THE SAME," International Application No. PCT/CN2020/092512, filed on May 27, 2020, entitled "THREE-DIMENSIONAL MEMORY DEVICES," and International Application No. PCT/CN2020/092513, filed on May 27, 2020, entitled "METHODS FOR FORMING THREE-DIMENSIONAL MEMORY DEVICES," all of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes an insulating layer, a semiconductor layer, a memory stack including interleaved conductive layers and dielectric layers, a source contact structure extending vertically through the insulating layer from an opposite side of the insulating layer with respect to the semiconductor layer to be in contact with the semiconductor layer, and a channel structure extending vertically through the memory stack and the semiconductor layer into the insulating layer or the source contact structure.

In another example, a 3D memory device includes an insulating layer, a semiconductor layer, a memory stack including interleaved conductive layers and dielectric layers, and a channel structure extending vertically through the memory stack and the semiconductor layer. The channel structure includes a memory film and a semiconductor channel, and part of the semiconductor channel along a sidewall of the channel structure is in contact with a sublayer of the semiconductor layer. The 3D memory device further includes an insulating structure extending vertically through the memory stack into the semiconductor layer, wherein a bottom surface of the insulating structure is flush with a top surface of the insulating layer.

In still another example, a method for forming a 3D memory device is disclosed. A stop layer, a first insulating layer, a sacrificial layer, a first semiconductor layer, and a dielectric stack are sequentially formed at a first side of a substrate. A channel structure is formed extending vertically through the dielectric stack, the first semiconductor layer, and the sacrificial layer into the first insulating layer. An opening extending is formed vertically through the dielectric stack and the first semiconductor layer, stopping at the sacrificial layer to expose part of the sacrificial layer. The sacrificial layer is replaced through the opening with a second semiconductor layer between the first semiconductor layer and the first insulating layer. The substrate is removed from a second side opposite to the first side of the substrate, stopping at the stop layer.

In yet another example, a method for forming a 3D memory device is disclosed. A first insulating layer, a sacrificial layer, a first semiconductor layer, and a dielectric stack are sequentially formed on a substrate. A channel structure is formed extending vertically through the dielectric stack, the first semiconductor layer, and the sacrificial layer into the first insulating layer. The sacrificial layer is replaced with a second semiconductor layer between the first semiconductor layer and the first insulating layer. At least one of the first and second semiconductor layers is doped with an N-type dopant. The N-type dopant is diffused in the first and second semiconductor layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
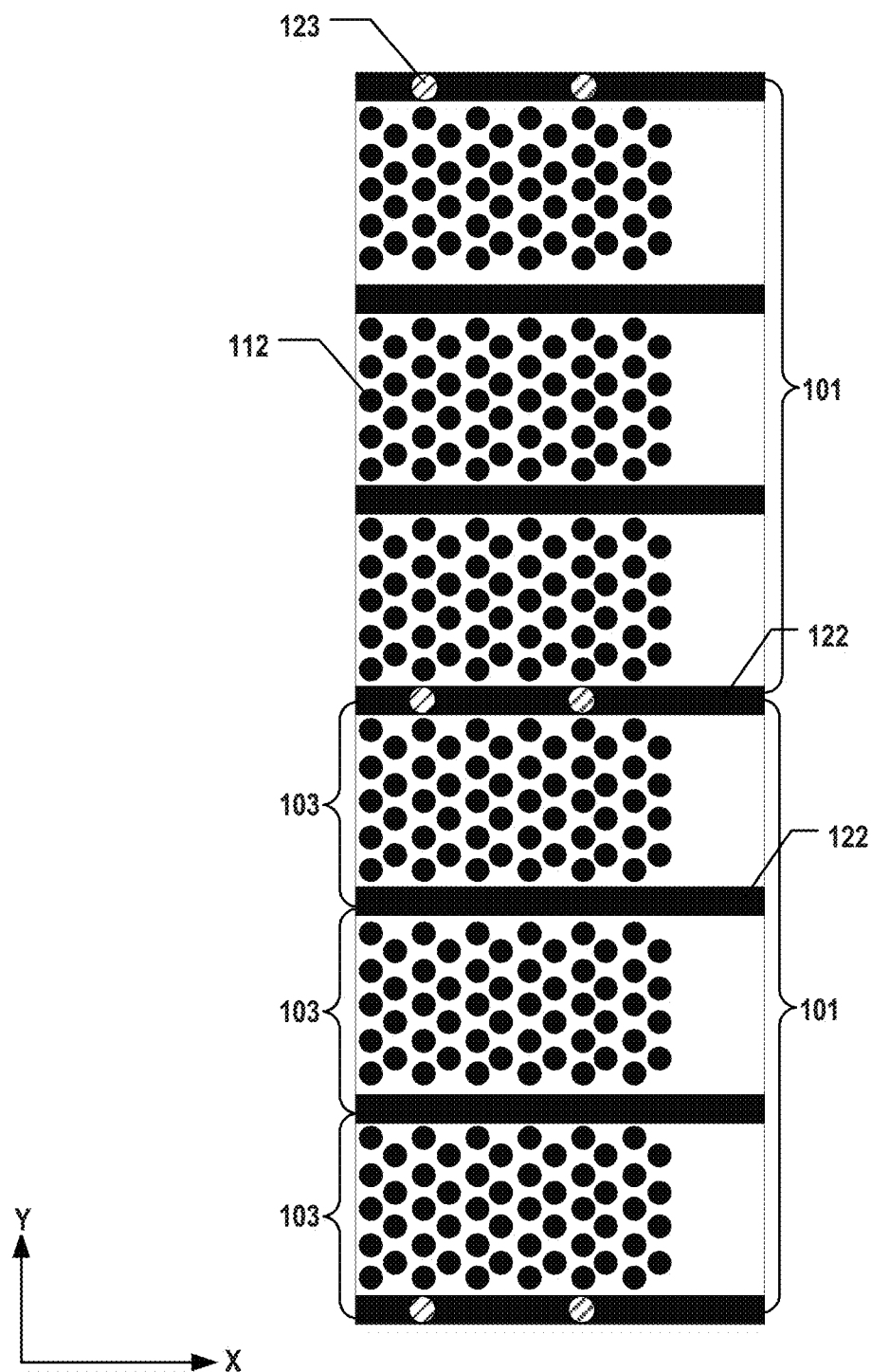
FIG. 1 illustrates a plan view of a cross-section of a 3D memory device with slit structures between memory blocks, according to various embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context.

For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture. Moreover, the sidewall SEG structure can be combined with backside processes to form source contact structures from the backside of the substrate to avoid leakage current and parasitic capacitance between front side source contact structures and word lines and increase the effective device area.

Since the backside processes require thinning the substrate, it faces challenges such as the thickness uniformity is difficult to control at the wafer level in the thinning process. These challenges limit the production yield of the 3D NAND memory devices with sidewall SEG structure and backside processes.

Moreover, existing 3D memory device often includes a plurality of memory blocks separated by parallel slit structures (e.g., gate line slits (GLSs)). For example, as shown in FIG. 1, a 3D memory device 100 includes a plurality of memory blocks 101 separated by slit structures 122 extending laterally in the x-direction (e.g., the word line direction). In each memory block 101, slit structures 122 with "H" cuts (not shown) further separate memory block 101 into multiple memory fingers 103, each of which includes an array of channel structures 112. It is noted that x and y axes are included in FIG. 1 to illustrate two orthogonal directions in the wafer plane. The x-direction is the word line direction, and the y-direction is the bit line direction. Adjacent memory blocks 101 arranged in the y-direction (e.g., the bit line direction) are separated by a respective slit structure 122 extending laterally in the x-direction (e.g., the word line direction).

In fabricating the 3D memory devices, the shape and dimensions of slit structures 122 may be susceptible to fluctuation, potentially affecting the performance of the final device. Slit structures 122 filled with conductive materials, such as tungsten (W) may also introduce significant stress to cause wafer bow or warp. The long, continuous slit openings of slit structures 122 between memory blocks 101 before being filled with filling materials may also cause the collapse of adjacent stack structures during the fabrication process, thereby reducing production yield. Thus, in some 3D memory devices, support structures 123 (e.g., dummy channel structures) filled with insulating materials (e.g., silicon dioxide) different from the material filling slit structures 122 are formed in slit structures 122 to make the 3D memory device less susceptible to deformation or damages during the fabrication process as well as to adjust the stress of the 3D memory device after fabrication.

Figure 2:
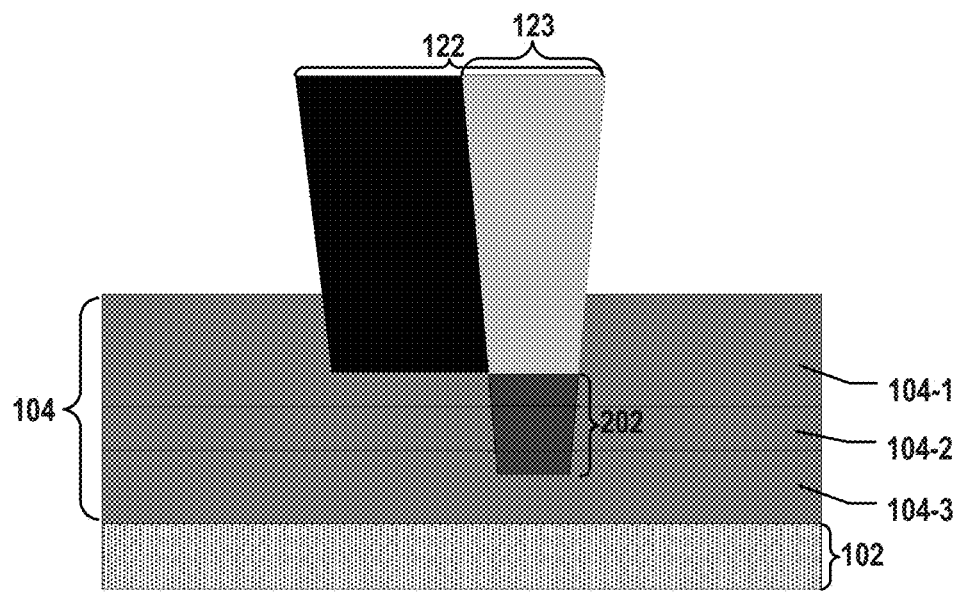
FIG. 2 illustrates a side view of a cross-section of an intermediate structure during the fabrication of the 3D memory device in FIG. 1.

However, when forming support structures 123 in slit structures 122, the overlapped portions between support structures 123 and slit structures 122 (needed to ensure the overlap between support structures and slit structures 122) can become the weak points because of the etching and gouging process for forming the insulating structure. For example, as shown in FIG. 2, an intermediate structure during the fabrication of 3D memory device 100 includes a substrate 102 and a semiconductor layer 104 having three sub-layers: a top semiconductor layer 104-1, a sacrificial layer 104-2 that will be replaced with another semiconductor layer in the final product, and a bottom semiconductor layer 104-3. FIG. 2 shows the cross-section of an overlapped portion of slit structure 122 and support structure 123 in FIG. 1 in the y-direction (e.g., the bit line direction). Slit structure 122 and support structure 123 each extend vertically through a dielectric stack (not shown) into semiconductor layer 104. During the fabrication, the overlapped portion 202 of slit structure 122 and support structure 123 is etched deeper, for example, into bottom semiconductor layer 104-3, compared with slit structure 122 or support structure 123 because two etching processes are applied to overlapped portion 202. The over-etch of overlapped portion 202 into bottom semiconductor layer 104-3 may cause bottom semiconductor layer 104-3 later being unintentionally removed when removing sacrificial layer 104-2 thereby reducing the production yield.

Various embodiments in accordance with the present disclosure provide improved 3D memory devices and fabrication methods thereof. A dielectric layer (i.e., an insulating layer), instead of the bottom semiconductor layer, can be formed below the sacrificial polysilicon layer, such that the bottom surface of the overlapped portion between the slit structure and the supporting structure lands on the dielectric layer, instead of a semiconductor layer, to avoid the week points happened during the sacrificial layer removing process, as described above. Moreover, when forming the channel structure, the channel hole etching can stop within the dielectric layer. This can also increase the channel hole process window. In some embodiments, a stop layer is further formed on the substrate to automatically stop the backside thinning process, such that the substrate can be completely removed to avoid the wafer thickness uniformity control issue and reduce the fabrication complexity of the backside processes.

Figure 3A:
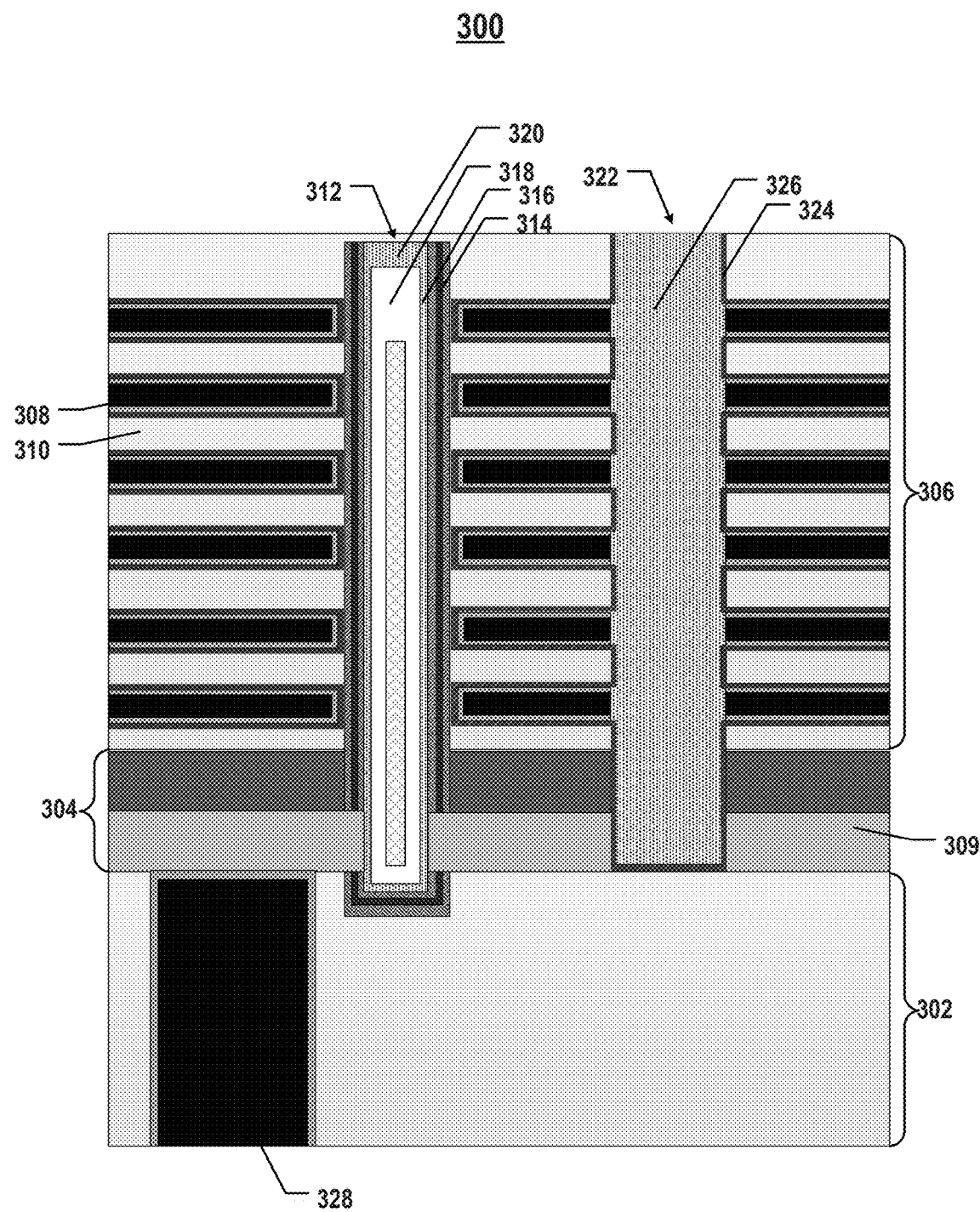
FIGS. 3A and 3B illustrate side views of cross-sections of various exemplary 3D memory devices, according to various embodiments of the present disclosure.
Figure 3B:
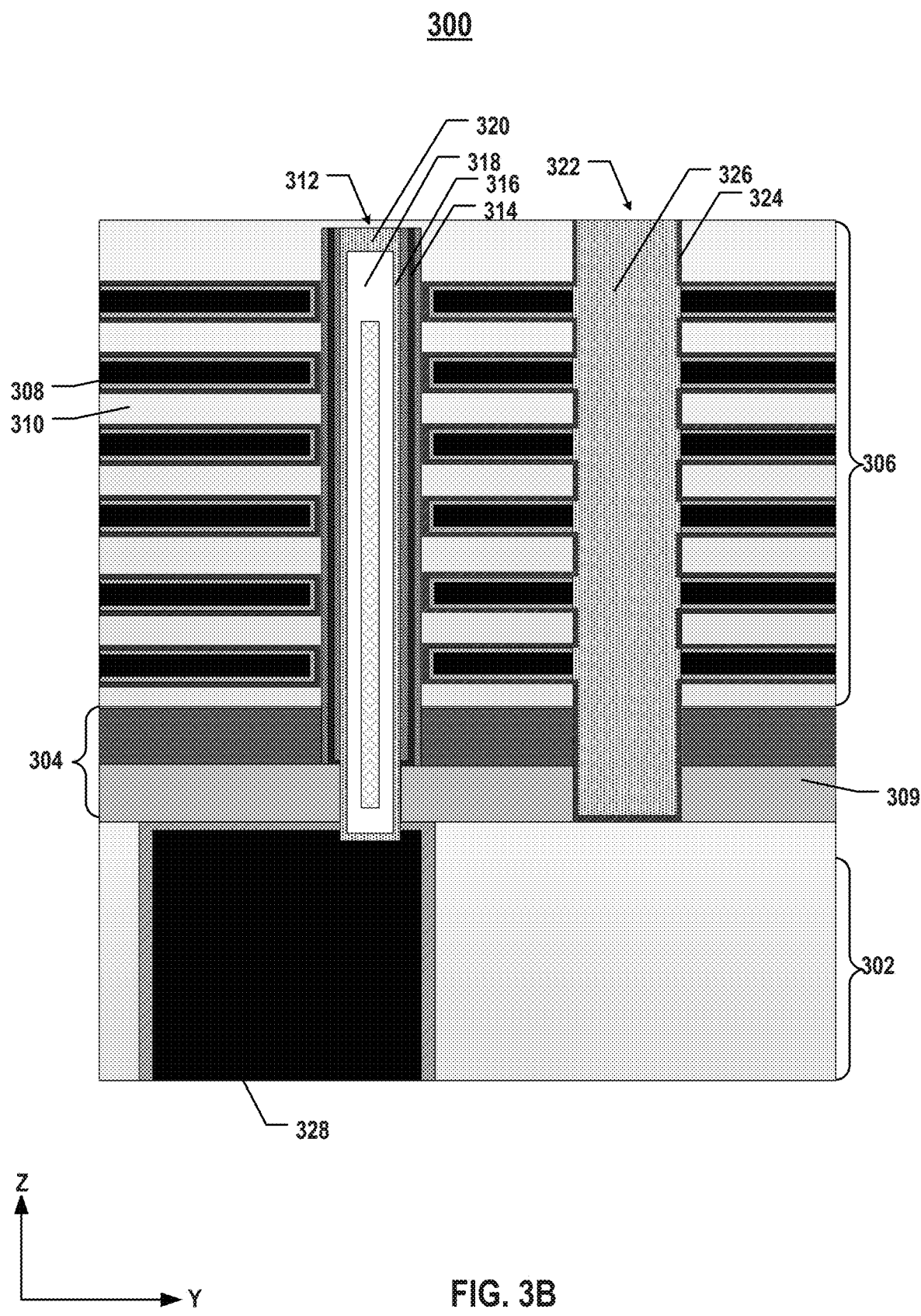

FIGS. 3A and 3B illustrate side views of cross-sections of various exemplary 3D memory devices, according to various embodiments of the present disclosure. In some embodiments, a 3D memory device 300 in FIG. 3A includes a substrate (not shown), which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof. It is noted that y and z axes are included in FIG. 3A to further illustrate the spatial relationship of the components in 3D memory device 300. The substrate of 3D memory device 300 includes two lateral surfaces (e.g., a top surface and a bottom surface) extending laterally in the y-direction (i.e., the bit line direction). As used herein, whether one component (e.g., a layer or a device) is "on," "above," or "below" another component (e.g., a layer or a device) of a 3D memory device (e.g., 3D memory device 100) is determined relative to the substrate of the 3D memory device in the z direction (i.e., the vertical direction) when the substrate is positioned in the lowest plane of the 3D memory device in the z-direction. The same notion for describing the spatial relationships is applied throughout the present disclosure.

In some embodiments, 3D memory device 300 is part of a non-monolithic 3D memory device, in which the components are formed separately on different substrates and then bonded in a face-to-face manner, a face-to-back manner, or a back-to-back manner Peripheral devices (not shown), such as any suitable digital, analog, and/or mixed-signal peripheral circuits used for facilitating the operation of 3D memory device 300, can be formed on a separate peripheral device substrate different from the memory array substrate on which the components shown in FIG. 3A are formed. It is understood that the memory array substrate may be removed from 3D memory device 300 as described below in detail, and the peripheral device substrate may become the substrate of 3D memory device 300. It is further understood that depending on the way how the peripheral device substrate and the memory array device substrate are bonded, the memory array devices (e.g., shown in FIG. 3A) may be in the original positions or may be flipped upside down in 3D memory device 300. For ease of reference, FIG. 3A depicts a state of 3D memory device 300 in which the memory array devices are in the original positions (i.e., not flipped upside down). However, it is understood that, in some examples, the memory array devices shown in FIG. 3A may be flipped upside down in 3D memory device 300, and their relative positions may be changed accordingly. The same notion for describing the spatial relationships is applied throughout the present disclosure.

As shown in FIGS. 3A and 3B, 3D memory device 300 can include a dielectric layer (i.e., an insulating layer) 302.

Dielectric layer 302 can include one or more interlayer dielectric (ILD) layers (also known as "intermetal dielectric (IMD) layers") in which the interconnect lines and VIA contacts can form. The ILD layers of dielectric layer 302 can include dielectric materials including, but not limited to, silicon oxide, silicon nitride, silicon oxynitride, low dielectric constant (low-k) dielectrics, or any combination thereof. In some embodiments, dielectric layer 302 includes silicon oxide.

3D memory device 300 can also include a semiconductor layer 304 above dielectric layer 302. In some embodiments, semiconductor layer 304 is disposed directly on dielectric layer 302. In some embodiments, semiconductor layer 304 includes polysilicon. For example, semiconductor layer 304 includes an N-type doped polysilicon layer, according to some embodiments. That is, semiconductor layer 304 can be doped with any suitable N-type dopants, such as phosphorus (P), arsenic (Ar), or antimony (Sb), which contribute free electrons and increase the conductivity of the intrinsic semiconductor. As described below in detail, due to a diffusion process, semiconductor layer 304 can have a nominally uniform doping concentration profile in the vertical direction. In some embodiments, the doping concentration of semiconductor layer 304 is between about $10^{19}$ $cm^{-3}$ and about $10^{22}$ $cm^{-3}$, such as between $10^{19}$ $cm^{-3}$ and $10^{22}$ $cm^{-3}$ (e.g., $10^{19}$ $cm^3$, $2\times10^{19}$ $cm^{-3}$, $3\times10^{19}$ $cm^{-3}$, $4\times10^{19}$ $cm^3$, $5\times10^{19}$ $cm^{-3}$, $6\times10^{19}$ $cm^{-3}$, $7\times10^{19}$ $cm^{-3}$, $8\times10^{19}$ $cm^{-3}$, $9\times10^{19}$ $cm^{-3}$, $10^{20}$ $cm^{-3}$, $2\times10^{20}$ $cm^{-3}$, $3\times10^{20}$ $cm^{-3}$, $4\times10^{20}$ $cm^{--3}$, $5\times10^{20}$ $cm^{-3}$, $6\times10^{20}$ $cm^{-3}$, $7\times10^{20}$ $cm^{-3}$, $8\times10^{20}$ $cm^{-3}$, $9\times10^{20}$ $cm^{-3}$, $10^{21}$ $cm^{-3}$, $2\times10^{21}$ $cm^{-3}$, $3\times10^{21}$ $cm^{-3}$, $4\times10^{21}$ $cm^{-3}$, $5\times10^{21}$ $cm^{-3}$, $6\times10^{21}$ $cm^3$, $7\times10^{21}$ $cm^{-3}$, $8\times10^{21}$ $cm^{-3}$, $9\times10^{21}$ $cm^{-3}$, $10^{22}$ $cm^{-3}$, any range bounded by the lower end by any of these values, or in any range defined by any two of these values). Although FIG. 3A shows that semiconductor layer 304 is above dielectric layer 302, as described above, it is understood that dielectric layer 302 may be above semiconductor layer 304 in some examples because the memory array devices shown in FIGS. 3A and 3B may be flipped upside down, and their relative positions may be changed accordingly in 3D memory device 300. In some embodiments, the memory array devices shown in FIGS. 3A and 3B are flipped upside down (in the top) and bonded to peripheral devices (in the bottom) in 3D memory device 300, such that dielectric layer 302 is above semiconductor layer 304.

In some embodiments, 3D memory device 300 further includes a source contact structure 328 extending vertically through dielectric layer 302 from the opposite side of semiconductor layer 304 with respect to dielectric layer 302 (i.e., the backside) to be in contact with semiconductor layer 304. The top surface of source contact structure 328 can nominally flush with the bottom surface of semiconductor layer 304 or extend further into semiconductor layer 304. Source contact structure 328 can electrically connect the source of the NAND memory strings of 3D memory device 300 to the peripheral devices through semiconductor layer 304 from the backside of the memory array substrate (removed) and thus, can be referred to herein as a "backside source pick up" as well. Source contact structure 328 can include any suitable types of contacts. In some embodiments, source contact structure 328 includes a VIA contact. In some embodiments, source contact structure 328 includes a wall-shaped contact extending laterally. Source contact structure 328 can include one or more conductive layers, such as a metal layer, for example, tungsten (W), cobalt (Co), copper (Cu), or aluminum (Al) or a silicide layer surrounded by a conductive adhesive layer (e.g., titanium nitride (TiN)).

In some embodiments, 3D memory device 300 is a NAND Flash memory device in which memory cells are provided in the form of an array of NAND memory strings. Each NAND memory string can include a channel structure 312 that extends through a plurality of pairs each including a stack conductive layer 308 and a stack dielectric layer 310 (referred to herein as "conductive/dielectric layer pairs"). The stacked conductive/dielectric layer pairs are also referred to herein as a memory stack 306. The number of the conductive/dielectric layer pairs in memory stack 306 (e.g., 32, 64, 96, 128, 160, 192, 224, 256, etc.) determines the number of memory cells in 3D memory device 300. Although not shown in FIGS. 3A and 3B, it is understood that in some embodiments, memory stack 306 may have a multi-deck architecture, such as a dual-deck architecture that includes a lower memory deck and an upper memory deck on the lower memory deck. The numbers of the pairs of stack conductive layers 308 and stack dielectric layers 310 in each memory deck can be the same or different.

Memory stack 306 can include a plurality of interleaved stack conductive layers 308 and stack dielectric layers 310. Stack conductive layers 308 and stack dielectric layers 310 in memory stack 306 can alternate in the vertical direction. In other words, except the ones at the top or bottom of memory stack 306, each stack conductive layer 308 can be adjoined by two stack dielectric layers 310 on both sides, and each stack dielectric layer 310 can be adjoined by two stack conductive layers 308 on both sides. Stack conductive layers 308 can include conductive materials including, but not limited to, W, Co, Cu, Al, polysilicon, doped silicon, silicides, or any combination thereof. Each stack conductive layer 308 can include a gate electrode (gate line) surrounded by an adhesion layer and a gate dielectric layer 324. The gate electrode of stack conductive layer 308 can extend laterally as a word line, ending at one or more staircase structures (not shown) of memory stack 306. Stack dielectric layers 310 can include dielectric materials including, but not limited to, silicon oxide, silicon nitride, silicon oxynitride, or any combination thereof.

As shown in FIGS. 3A and 3B, each channel structure 312 extending vertically through memory stack 306 and semiconductor layer 304 into dielectric layer 302. That is, channel structure 312 can include three portions: the lower portion surrounded by dielectric layer 302 (i.e., below the interface between semiconductor layer 304 and dielectric layer 302), the middle portion surrounded by semiconductor layer 304 (i.e., between the top and bottom surfaces of semiconductor layer 304), and the upper portion surrounded by memory stack 306 (i.e., above the interface between semiconductor layer 304 and memory stack 306). As used herein, the "upper portion/end" of a component (e g , channel structure 312) is the portion/end farther away from the substrate in the z-direction, and the "lower portion/end" of the component (e g , channel structure 312) is the portion/end closer to the substrate in the z-direction when the substrate is positioned in the lowest plane of 3D memory device 300. In some embodiments, each channel structure 312 extends vertically into dielectric layer 302. For example, the lower end of channel structure 312 may be lower than the top surface of dielectric layer 302. As a result, the processing window for channel structure 312 can be increased accordingly.

In some embodiments as shown in FIG. 3A, channel structure 312 is spaced apart from source contact structure 328 laterally in dielectric layer 302. For example, as illustrated in FIG. 3A, the lower portion of channel structures 312 surrounded by dielectric layer 302 is spaced apart from source contact structure 328 in dielectric layer 302 in the y-direction. In some embodiments as shown in FIG. 3B, instead of extending into dielectric layer 302, channel structures 312 extends into source contact structure 328. Source contact structure 328 thus can be in contact with semiconductor channel 316 of the lower portion of channel structure 312. By allowing channel structure 312 to extend into and contact source contact structure 328 directly, the feature size of source contact structure 328 can be increased, thereby increasing the overlay margin of channel structure 312 as well.

Channel structure 312 can include a channel hole filled with semiconductor material(s) (e.g., as a semiconductor channel 316) and dielectric material(s) (e.g., as a memory film 314). In some embodiments, semiconductor channel 316 includes silicon, such as amorphous silicon, polysilicon, or single crystalline silicon. In one example, semiconductor channel 316 includes polysilicon. In some embodiments, memory film 314 is a composite layer including a tunneling layer, a storage layer (also known as a "charge trap layer"), and a blocking layer. The remaining space of the channel hole can be partially or fully filled with a capping layer 318 including dielectric materials, such as silicon oxide and/or an air gap. Channel structure 312 can have a cylinder shape (e.g., a pillar shape). Capping layer 318, semiconductor channel 316, the tunneling layer, the storage layer, and the blocking layer of memory film 314 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, or any combination thereof. The blocking layer can include silicon oxide, silicon oxynitride, high-k dielectrics, or any combination thereof. In one example, memory film 314 can include a composite layer of silicon oxide/silicon oxynitride/silicon oxide (ONO). In some embodiments, channel structure 312 further includes a channel plug 320 at the top of the upper portion of channel structure 312. Channel plug 320 can include semiconductor materials (e.g., polysilicon). In some embodiments, channel plug 320 functions as the drain of the NAND memory string.

As shown in FIGS. 3A and 3B, part of semiconductor channel 316 along the sidewall of channel structure 312 (e.g., in the middle portion of channel structure 312) is in contact with a sublayer 309 of semiconductor layer 304, according to some embodiments. That is, memory film 314 is disconnected in the middle portion of channel structure 312 that abuts sublayer 309 of semiconductor layer 304, exposing semiconductor channel 316 to be in contact with the surrounding sublayer 309 of semiconductor layer 304, according to some embodiments. As a result, sublayer 309 of semiconductor layer 304 surrounding and in contact with semiconductor channel 316 can work as the "sidewall SEG" of channel structure 312 to replace the "bottom SEG" as described above, which can mitigate issues such as overlay control, epitaxial layer formation, and SONO punch. As described below in detail, sublayer 309 of semiconductor layer 304 is formed separately from the rest of semiconductor layer 304, according to some embodiments. However, it is understood that as sublayer 309 of semiconductor layer 304 may have the same polysilicon material as the rest of semiconductor layer 304, and the doping concentration may be nominally uniform in semiconductor layer 304 after diffusion. Sublayer 309 thus may not be distinguishable from the rest of semiconductor layer 304 in 3D memory device 300. Nevertheless, sublayer 309 refers to the part of semiconductor layer 304 that is in contact with semiconductor channel 316, instead of memory film 314, in the middle portion of channel structure 312.

As shown in FIGS. 3A and 3B, 3D memory device 300 can further include insulating structures 322 each extending vertically through interleaved stack conductive layers 308 and stack dielectric layers 310 of memory stack 306. Insulating structure 322 may be one example of slit structures 122 in FIG. 1, which is filled with dielectrics and does not include a conductive contact therein. Insulating structure 322 extends through the entire thickness of semiconductor layer 304, stopping at the top surface of dielectric layer 302, according to some embodiments. That is, the bottom surface of insulating structure 322 is nominally flush with the top surface of dielectric layer 302, according to some embodiments. Each insulating structure 322 can also extend laterally to separate channel structures 312 into a plurality of memory blocks (e.g., as one example of slit structures 122 in FIG. 1). That is, memory stack 306 can be divided into a plurality of memory blocks by insulating structures 322, such that the array of channel structures 312 can be separated into each memory block. Different from the slit structures in some 3D NAND memory devices, which include front side source contact structures, insulating structure 322 does not include any contact therein (i.e., not functioning as the source contact structure) and thus, does not introduce parasitic capacitance and leakage current with stack conductive layers 308 (including word lines), according to some embodiments. In some embodiments, each insulating structure 322 includes an opening (e.g., a slit) filled with one or more dielectric materials, including, but not limited to, silicon oxide, silicon nitride, silicon oxynitride, or any combination thereof. In one example, each insulating structure 322 may be filled with silicon oxide as an insulator core 326 and high-k dielectrics connecting with a gate dielectric layer 324 surrounding stack conductive layers 308.

In some embodiments, by doping semiconductor layer 304 with N-type dopants, i.e., eliminating a P-well as the source of holes, 3D memory device 300 is configured to generate gate-induced drain leakage (GIDL)-assisted body biasing when performing an erase operation, according to some embodiments. The GIDL around the source select gate of the NAND memory string can generate a hole current into the NAND memory string to raise the body potential for erase operations.

As shown in FIGS. 3A and 3B, insulating structure 322 extends vertically through memory stack 306 and the entirety of semiconductor layer 304, such that the bottom surface of insulating structure 322 lands on the top surface of dielectric layer 302.

Figure 4:
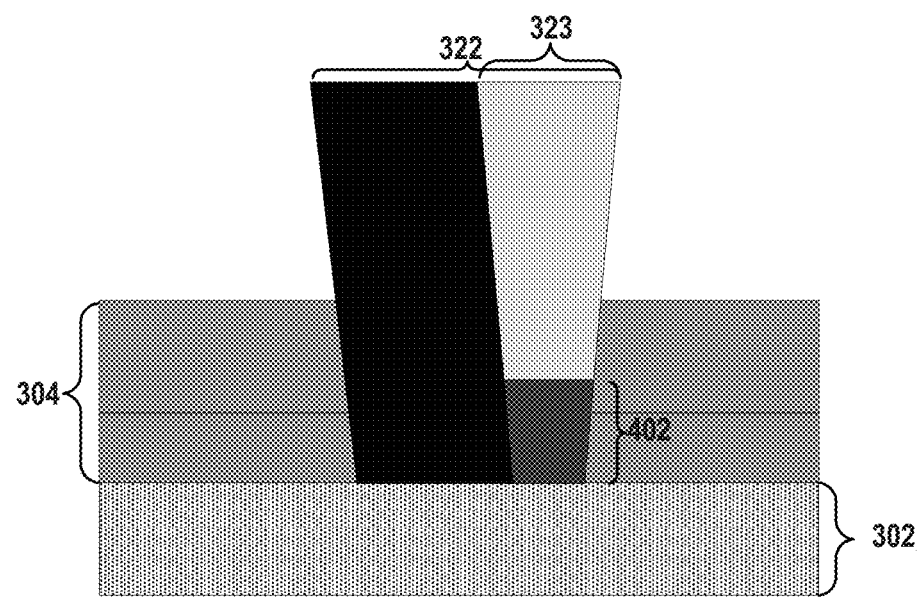
FIG. 4 illustrates a side view of a cross-section of an exemplary 3D memory device with insulating structures between memory blocks, according to various embodiments of the present disclosure.
Figure 4:
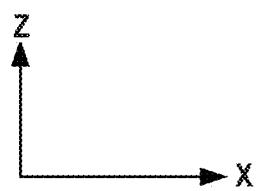

For example, as shown in FIG. 4, an intermediate structure during the fabrication of 3D memory device 300 includes dielectric layer 302 and a semiconductor layer 304 as described above. FIG. 4 shows the cross-section of an overlapped portion of insulating structure 322 and a support structure 423 (e.g., corresponding to support structure 123 in FIGS. 1 and 2). Insulating structure 322 and support structure 423 each extend vertically through memory stack 306 (not shown) and the entirety of semiconductor layer 304, such that the bottom surfaces of insulating structure 322 and support structure 423 land on the top surface of dielectric layer 302. During the fabrication, the overlapped portion 402 of insulating structure 322 and support structure 423 lands on dielectric layer 302, instead of a part of semiconductor layer 304 (e.g., bottom semiconductor layer 104-3 in FIG. 2). This can avoid the week points that happened during the sacrificial layer removing process and can avoid reducing the production yield caused by unintentionally removed bottom semiconductor layer (e.g., bottom semiconductor layer 104-3 in FIG. 2), as described above.

As described above and further described below in detail, the memory array substrate on which dielectric layer 302, semiconductor layer 304, memory stack 306, channel structures 312, and insulating structure 322 are formed is removed from 3D memory device 300, such that 3D memory device 300 does not include the memory array substrate, according to some embodiments.

FIGS. 5A-5K illustrate a fabrication process for forming an exemplary 3D memory device, according to some embodiments of the present disclosure. FIG. 6 illustrates a flowchart of a method 600 for forming an exemplary 3D memory device, according to some embodiments of the present disclosure. Examples of the 3D memory device depicted in FIGS. 5A-5K and 6 include 3D memory device 300 depicted in FIGS. 3A and 3B. FIGS. 5A-5K and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a stop layer, a first dielectric layer (i.e., a first insulating layer), a sacrificial layer, a first semiconductor layer, and a dielectric stack are sequentially formed at a first side of a substrate. The substrate can be a silicon substrate or a carrier substrate, made of any suitable materials, such as glass, sapphire, plastic, to name a few, to reduce the cost of the substrate. The first side can be the front side of the substrate on which semiconductor devices can be formed. In some embodiments, the stop layer can include silicon nitride. The dielectric layer can include dielectric materials including, but not limited to, silicon oxide, silicon nitride, silicon oxynitride, or any combination thereof. In some embodiments, to form the sacrificial layer, a first sacrificial layer and a second sacrificial layer are sequentially formed. The first sacrificial layer can include polysilicon or silicon nitride, and the second sacrificial layer can include silicon oxynitride. The dielectric stack can include a plurality of interleaved stack sacrificial layers and stack dielectric layers. In some embodiments, the first semiconductor layer includes polysilicon.

Figure 5A:
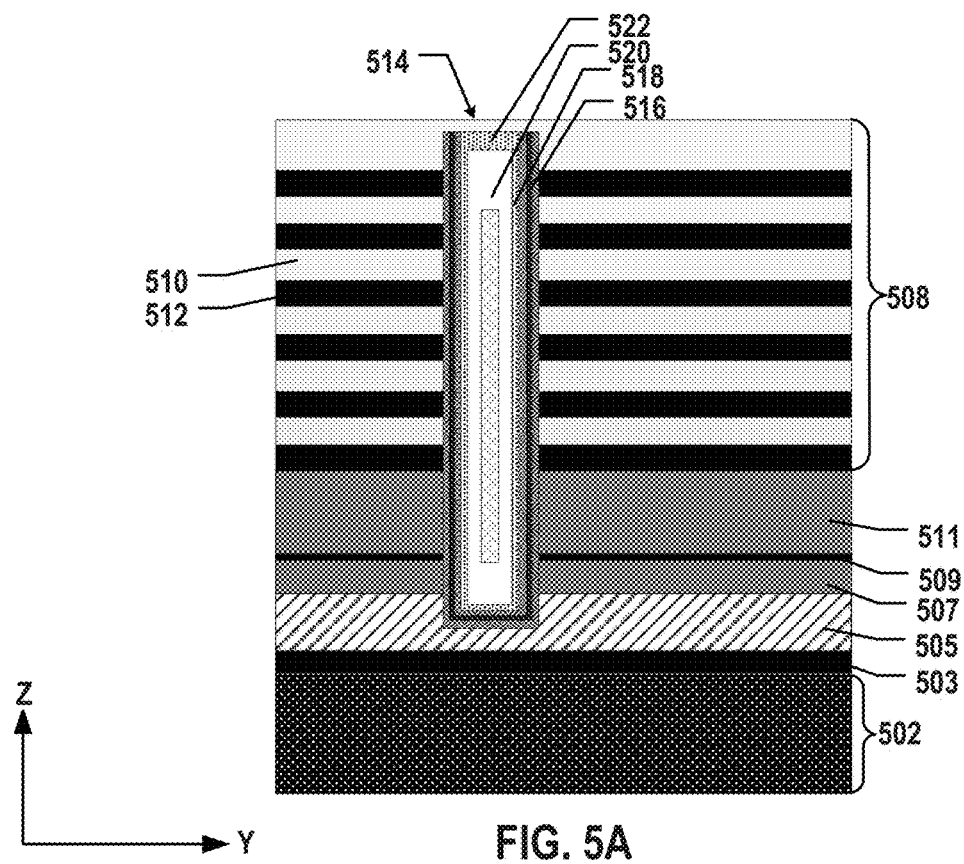
FIGS. 5A-5L illustrate a fabrication process for forming an exemplary 3D memory device, according to some embodiments of the present disclosure.
Figure 6:
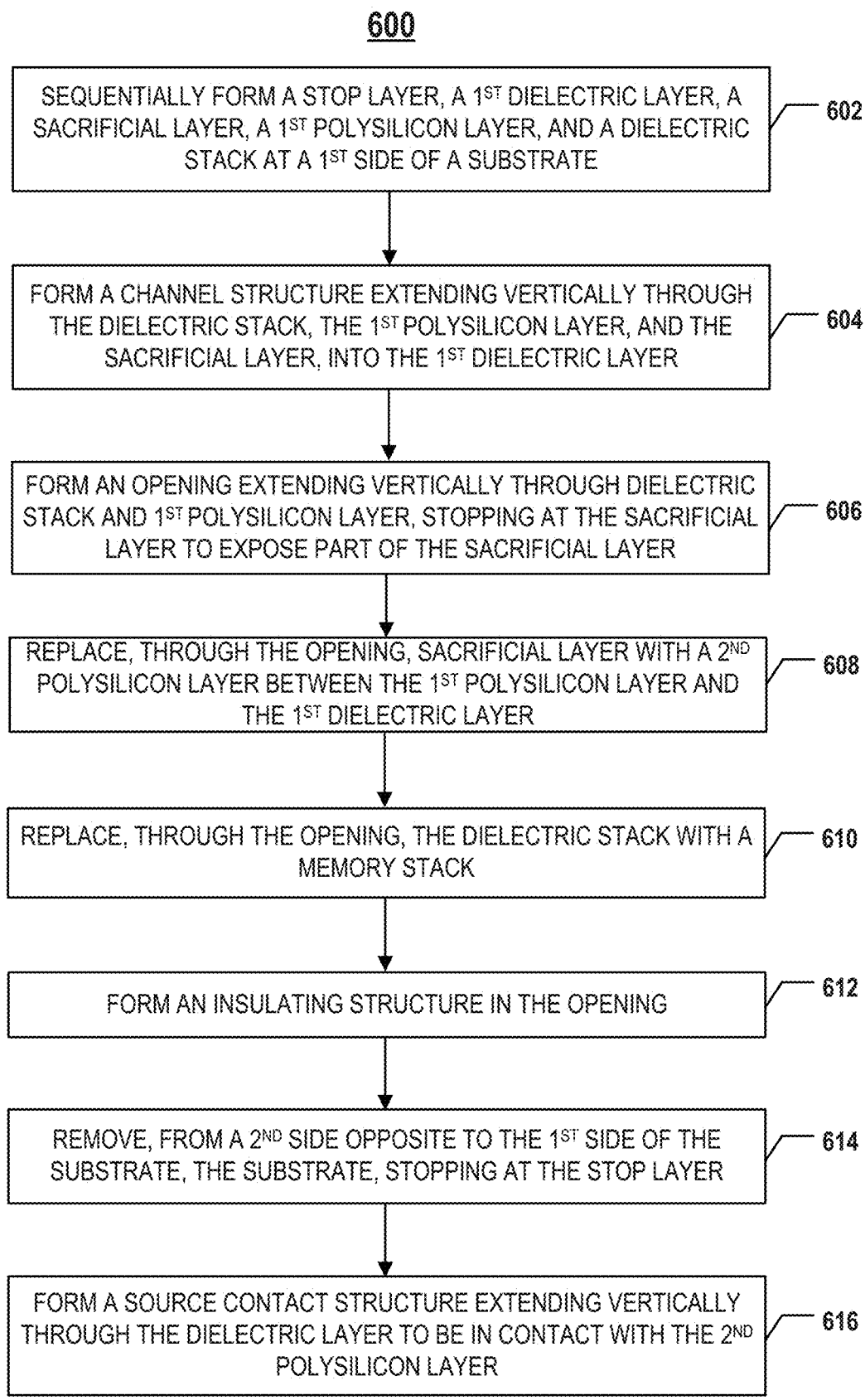
FIG. 6 illustrates a flowchart of a method for forming an exemplary 3D memory device, according to some embodiments of the present disclosure.

As illustrated in FIG. 5A, a stop layer 503, a first dielectric layer (i.e., a first insulating layer) 505, a first sacrificial layer 507, a second sacrificial layer 509, a first semiconductor layer 511, and a dielectric stack 508 are sequentially formed at the front side of a substrate 502. Substrate 502 can be a silicon substrate, or a carrier substrate made of any suitable materials, such as glass, sapphire, plastic, to name a few. In some embodiments, stop layer 503 includes silicon nitride. As described below in detail, stop layer 503 can act as the stop layer when removing substrate 502 from the backside and thus, may include any other suitable materials other than the material of substrate 502. It is understood that in some embodiments, pad oxide layers (e.g., silicon oxide layers) may be formed between substrate 502 and stop layer 503 to relax the stress between different layers. Similarly, another pad oxide layer may be formed between stop layer 503 and first dielectric layer 505 to relax the stress therebetween.

First and second sacrificial layers 507 and 509 may be collectively referred to herein as a sacrificial layer. In some embodiments, first and second sacrificial layers 507 and 509 include polysilicon or silicon nitride, and silicon oxynitride, respectively. As described below in detail, first sacrificial layer 507 can be later selectively removed and thus, may include any other suitable materials that have a high etching selectivity (e.g., greater than about 5) with respect to silicon oxide, such as polysilicon, silicon nitride, or carbon. Second sacrificial layer 509 can act as the stop layer when etching first sacrificial layer 507 and can be later selectively removed and thus, may include any other suitable materials that have a high etching selectivity (e.g., greater than about 5) with respect to polysilicon (the material of first sacrificial layer 507 and first semiconductor layer 511).

Stop layer 503, first dielectric layer 505, first sacrificial layer 507, second sacrificial layer 509, and first semiconductor layer 511 (or any other layers therebetween) can be formed by sequentially depositing corresponding materials in this order in multiple cycles using one or more thin film deposition processes including, but not limited to, chemical vapor deposition (CVD), physical vapor deposition (PVD), atomic layer deposition (ALD), electroplating, electroless deposition, any other suitable deposition processes, or any combination thereof. In some embodiments, first semiconductor layer 511 is doped with N-type dopants, such as P, As, or Sb. In one example, first semiconductor layer 511 may be doped using an ion implantation process after depositing polysilicon materials. In another example, in-situ doping of N-type dopants may be performed when depositing polysilicon to form first semiconductor layer 511. It is understood that in some examples, first semiconductor layer 511 is not doped with N-type dopants at this stage.

As illustrated in FIG. 5A, a dielectric stack 508 including a plurality pairs of a first dielectric layer (known as a "stack sacrificial layer 512") and a second dielectric layer (known as a "stack dielectric layer 510") is formed on first semiconductor layer 511. Dielectric stack 508 includes interleaved stack sacrificial layers 512 and stack dielectric layers 510, according to some embodiments. Stack dielectric layers 510 and stack sacrificial layers 512 can be alternatively deposited on first semiconductor layer 511 to form dielectric stack 508. In some embodiments, each stack dielectric layer 510 includes a layer of silicon oxide, and each stack sacrificial layer 512 includes a layer of silicon nitride. Dielectric stack 508 can be formed by one or more thin film deposition processes including, but not limited to, CVD, PVD, ALD, or any combination thereof. In some embodiments, a pad oxide layer (e.g., silicon oxide layer, not shown) is formed between first semiconductor layer 511 and dielectric stack 508.

Method 600 proceeds to operation 604, as illustrated in FIG. 6, in which a channel structure extending vertically through the dielectric stack, the first semiconductor layer, and the sacrificial layer into the first dielectric layer is formed. In some embodiments, to form the channel structure, a channel hole extending vertically through the dielectric stack, the first semiconductor layer, and the sacrificial layer into the first dielectric layer is formed, and a memory film and a semiconductor channel are sequentially formed along a sidewall of the channel hole. In some embodiments, a channel plug is formed above and in contact with the semiconductor channel As mentioned above and described below in detail, in some embodiments, instead of extending into the dielectric layer, the channel structure can also extend into a source contact structure. For example, the source contact structure may later be formed in the dielectric layer, extending laterally to be in contact with the part of the channel structure within the dielectric layer. The channel structure can be viewed as extending into and stopping within the source contact structure.

As illustrated in FIG. 5A, a channel hole is an opening extending vertically through dielectric stack 508, first semiconductor layer 511, and sacrificial layers 509 and 511, stopping within first dielectric layer 505. In some embodiments, a plurality of openings are formed, such that each opening becomes the location for growing an individual channel structure 514 in the later process. In some embodiments, fabrication processes for forming the channel hole of channel structure 514 include wet etching and/or dry etching processes, such as deep-ion reactive etching (DRIE). The etching of the channel hole continues until stopped within first dielectric layer 505, such as the channel hole extends below a top surface of first dielectric layer 505, according to some embodiments. In some embodiments, the etching conditions, such as etching rate and time, can be controlled to ensure that each channel hole has reached and stopped within first dielectric layer 505 to increase the processing window of the channel holes and channel structures 514 formed therein.

As illustrated in FIG. 5A, a memory film 516 (including a blocking layer, a storage layer, and a tunneling layer) and a semiconductor channel 518 are sequentially formed in this order along sidewalls and the bottom surface of the channel hole. In some embodiments, memory film 516 is first deposited along the sidewalls and bottom surface of the channel hole, and semiconductor channel 518 is then deposited over memory film 516. The blocking layer, storage layer, and tunneling layer can be subsequently deposited in this order using one or more thin film deposition processes, such as ALD, CVD, PVD, any other suitable processes, or any combination thereof, to form memory film 516. Semiconductor channel 518 can then be formed by depositing a semiconductor material, such as polysilicon, over the tunneling layer of memory film 516 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 516 and semiconductor channel 518.

As illustrated in FIG. 5A, a capping layer 520 is formed in the channel hole and over semiconductor channel 518 to completely or partially fill the channel hole (e.g., without or with an air gap). Capping layer 520 can be formed by depositing a dielectric material, such as silicon oxide, using one or more thin film deposition processes, such as ALD, CVD, PVD, any other suitable processes, or any combination thereof. A channel plug 522 then can be formed in the upper portion of the channel hole. In some embodiments, parts of memory film 516, semiconductor channel 518, and capping layer 520 that are on the top surface of dielectric stack 508 are removed and planarized by CMP, wet etch, and/or dry etch processes. A recess then can be formed in the upper portion of the channel hole by wet etching and/or drying etching parts of semiconductor channel 518 and capping layer 520 in the upper portion of the channel hole. Channel plug 522 then can be formed by depositing semiconductor materials, such as polysilicon, into the recess by one or more thin film deposition processes, such as CVD, PVD, ALD, or any combination thereof. Channel structure 514 is thereby formed through dielectric stack 508, first semiconductor layer 511, and sacrificial layers 509 and 511 into first dielectric layer 505, according to some embodiments.

Method 600 proceeds to operation 606, as illustrated in FIG. 6, in which an opening extending vertically through the dielectric stack and the first semiconductor layer, stopping at the sacrificial layer is formed to expose part of the sacrificial layer. In some embodiments, forming the opening is stopped at the second sacrificial layer.

Figure 5B:
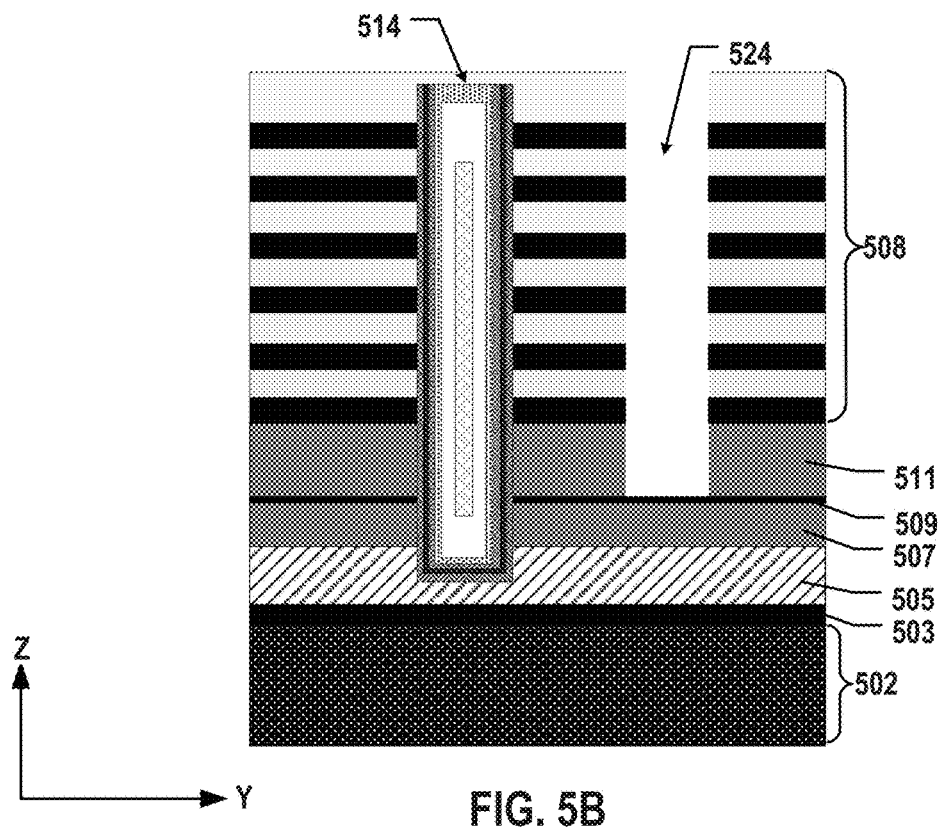

As illustrated in FIG. 5B, a slit 524 is an opening formed that extends vertically through dielectric stack 508 and first semiconductor layer 511, stopping at second sacrificial layer 509, which exposes part of second sacrificial layer 509. In some embodiments, fabrication processes for forming slit 524 include wet etch and/or dry etch processes, such as DRIE. In some embodiments, stack dielectric layers 510 and stack sacrificial layers 512 of dielectric stack 508 are first etched. The etching of dielectric stack 508 may not stop at the top surface of first semiconductor layer 511 and may extend further into first semiconductor layer 511 with various depths, i.e., gouging variation. Thus, a second etching process (sometimes known as post etching treatment) can be performed to etch first semiconductor layer 511 until being stopped by second sacrificial layer 509 (e.g., a silicon oxynitride layer) due to the etching selectivity between the materials of second sacrificial layer 509 and first semiconductor layer 511 (e.g., polysilicon).

Method 600 proceeds to operation 608, as illustrated in FIG. 6, in which the sacrificial layer is replaced, through the opening, with a second semiconductor layer between the first semiconductor layer and the first dielectric layer. In some embodiments, the second semiconductor layer includes polysilicon. In some embodiments, to replace the sacrificial layer with the second semiconductor layer, the sacrificial layer is removed, through the opening, to form a cavity between the first semiconductor layer and the first dielectric layer, part of the memory film is removed, through the opening, to expose part of the semiconductor channel along the sidewall of the channel hole, and polysilicon is deposited, through the opening, into the cavity to form the second semiconductor layer. In some embodiments, at least one of the first or second semiconductor layers is doped with an N-type dopant. The N-type dopant can be diffused in the first and second semiconductor layers.

Figure 5C:
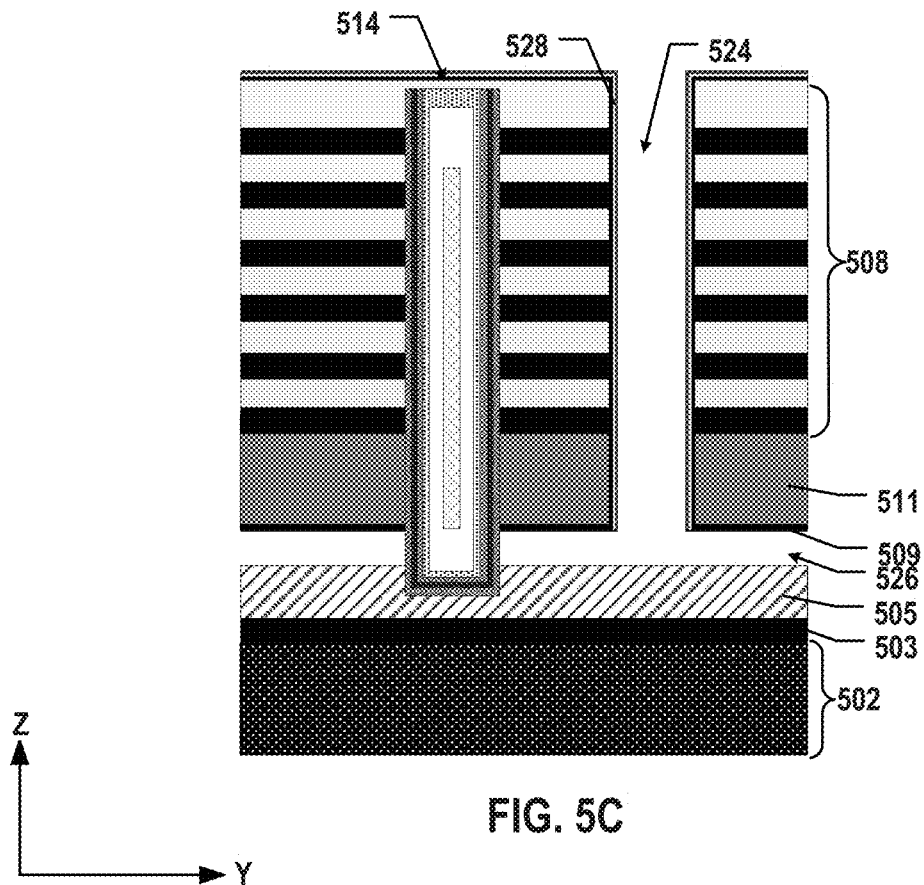

As illustrated in FIG. 5C, a spacer 528 is formed along the sidewall of slit 524 by depositing one or more dielectrics, such as high-k dielectrics, along the sidewall of slit 524. The bottom surface of spacer 528 (and part of second sacrificial layer 509 in slit 524 if still remains) can be opened using wet etch and/or dry etch processes to expose part of first sacrificial layer 507 (shown in FIG. 5B, e.g., a polysilicon layer). In some embodiments, first sacrificial layer 507 is then removed by wet etching and/or dry etching to form a cavity 526. In some embodiments, first sacrificial layer 507 includes polysilicon, spacer 528 includes a high-k dielectric, second sacrificial layers 509 includes silicon oxynitride are etched by applying tetramethylammonium hydroxide (TMAH) etchant through slit 524, which can be stopped by the high-k dielectric of spacer 528 as well as the silicon oxynitride of second sacrificial layer 509. That is, the removal of first sacrificial layer 507 does not affect dielectric stack 508 and first semiconductor layer 511 protected by spacer 528 and second sacrificial layer 509, respectively, according to some embodiments.

Figure 5D:
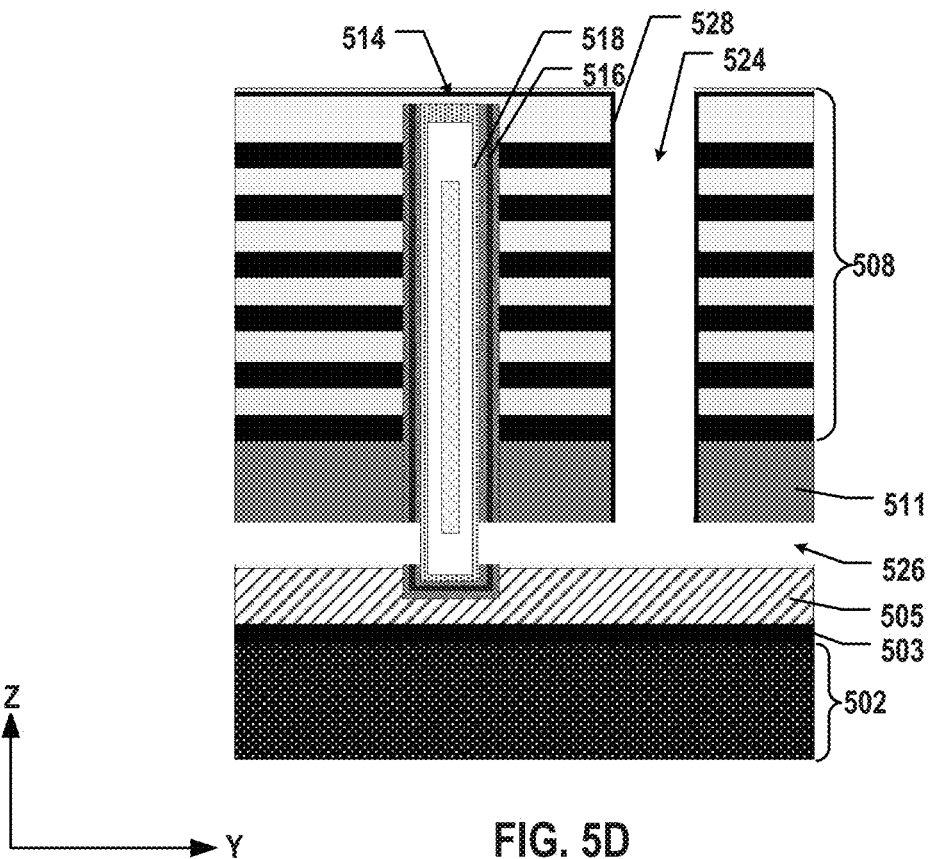

As illustrated in FIG. 5D, part of memory film 516 exposed in cavity 526 is removed to expose part of semiconductor channel 518 along the sidewall of channel structure 514. In some embodiments, parts of the blocking layer (e.g., including silicon oxide), storage layer (e.g., including silicon nitride), and tunneling layer (e.g., including silicon oxide) are etched by applying etchants through slit 524 and cavity 526, for example, phosphoric acid for etching silicon nitride and hydrofluoric acid for etching silicon oxide. The etching can be stopped by spacer 528 and semiconductor channel 518. That is, the removal of part of memory film 516 exposed in cavity 526 does not affect dielectric stack 508 (protected by spacer 528) and semiconductor channel 518 including polysilicon and capping layer 520 enclosed by semiconductor channel 518, according to some embodiments. In some embodiments, second sacrificial layers 509 (including silicon oxynitride) is removed as well by the same etching process.

Figure 5E:
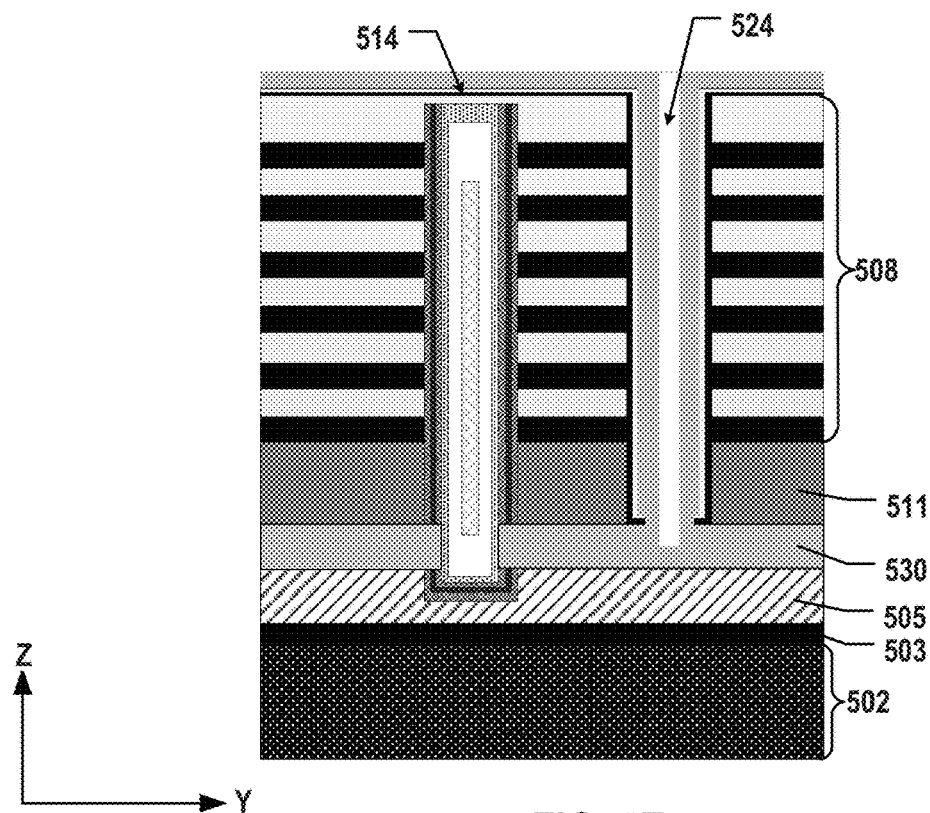
Figure 5F:
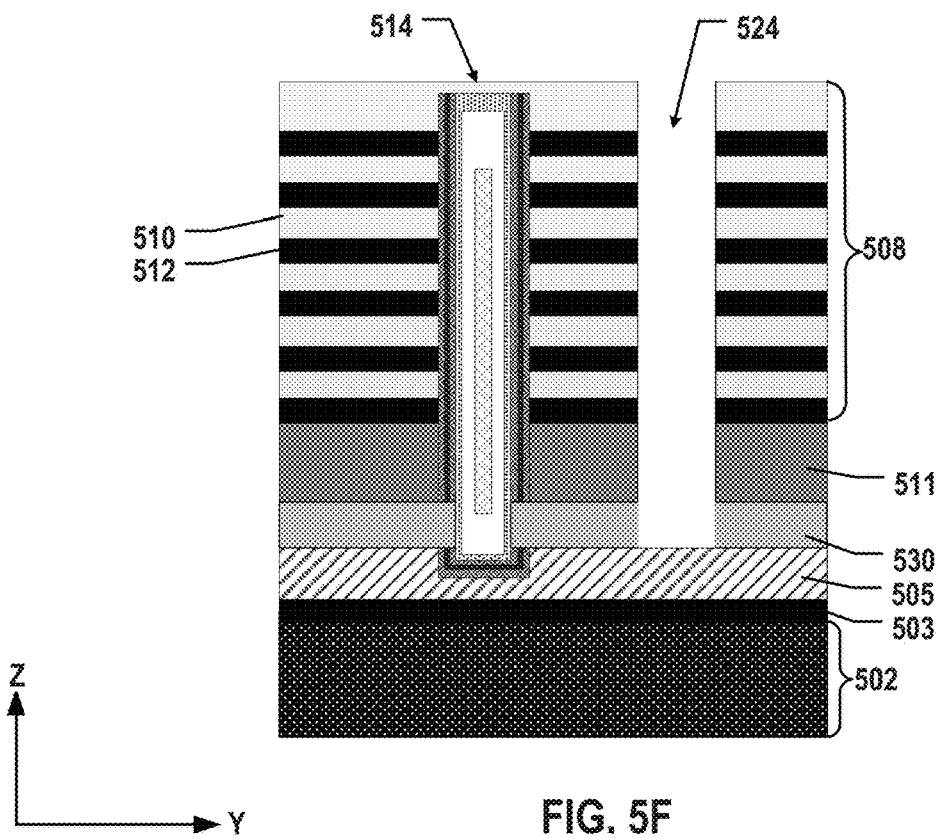

As illustrated in FIG. 5E, a second semiconductor layer 530 is formed between first semiconductor layer 511 and first dielectric layer 505. In some embodiments, second semiconductor layer 530 is formed by depositing polysilicon into cavity 526 (shown in FIG. 5D) through slit 524 using one or more thin film deposition processes, such as CVD, PVD, ALD, or any combination thereof. In some embodiments, polysilicon remains in the lower portion of slit 524 is removed, such that the bottom surface of slit 524 is flush with the top surface of first dielectric layer 505, and part of first dielectric layer 505 is exposed from slit 524, as shown in FIG. 5F. In some embodiments, in-situ doping of N-type dopants, such as P, As, or Sb, is performed when depositing polysilicon to form second semiconductor layer 530. Second semiconductor layer 530 can fill cavity 526 to be in contact with the exposed part of semiconductor channel 518 of channel structure 514. It is understood that second semiconductor layer 530 may be doped or un-doped depending on whether first semiconductor layer 511 is doped with N-type dopants since at least one of first and second semiconductor layers 511 and 530 may need to be doped with N-type dopants. In some embodiments, the N-type dopants in at least one of first and second semiconductor layers 511 and 530 is diffused to achieve a uniform doping concentration profile in the vertical direction among first and second semiconductor layers 511 and 530 using thermal diffusion process, such as annealing. For example, the doping concentration may be between $10^{19}$ cm$^{-3}$ and $10^{22}$ cm$^{-3}$ after diffusion. As described above, the interfaces between first and second semiconductor layers 511 and 530 may become indistinguishable as each of first and second semiconductor layers 511 and 530 includes the same polysilicon material with nominally the same doping concentration. Thus, first and second semiconductor layers 511 and 530 may be collectively viewed as a semiconductor layer after diffusion.

Method 600 proceeds to operation 610, as illustrated in FIG. 6, in which the dielectric stack is replaced, through the opening, with a memory stack using the so-called "gate replacement process." As illustrated in FIG. 5F, part of second semiconductor layer 530 and any remaining spacer 528 formed along the sidewall of slit 524 (shown in FIG. 5E), are removed using wet etching and/or dry etching to expose stack sacrificial layers 512 of dielectric stack 508 through slit 524. Part of second semiconductor layer 530 on first dielectric layer 505, along slit 524 (shown in FIG. 5E), are also removed using wet etching and/or dry etching such that slit 524 stops at the top surface of first dielectric layer 505. The etching process can be controlled (e.g., by controlling the etching rate and/or time), such that the remainder of second semiconductor layer 530 still remains between first semiconductor layer 511 and first dielectric layer 505 and in contact with semiconductor channel 518 of channel structure 514.

Figure 5G:
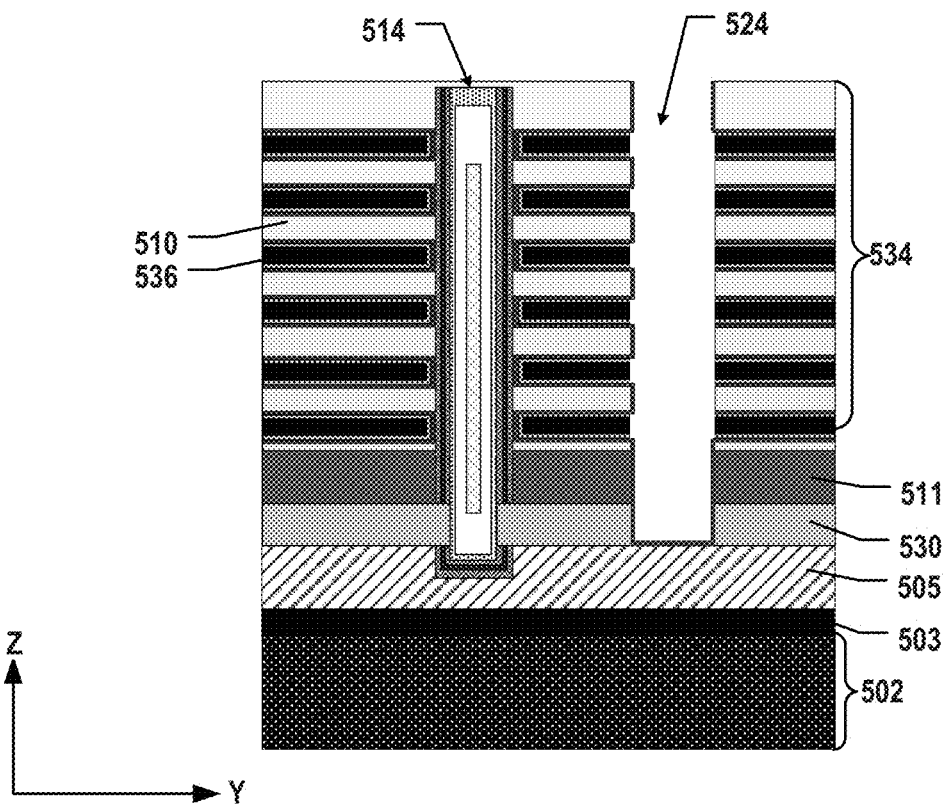

As illustrated in FIG. 5G, a memory stack 534 can be formed by a gate replacement process, i.e., replacing stack sacrificial layers 512 with stack conductive layers 536. Memory stack 534 thus can include interleaved stack conductive layers 536 and stack dielectric layers 510 on first semiconductor layer 511. In some embodiments, to form memory stack 534, stack sacrificial layers 512 are removed by applying etchants through slit 524 to form a plurality of lateral recesses. Stack conductive layers 536 then can be deposited into the lateral recesses by depositing one or more conductive materials using one or more thin film deposition processes, such as PVD, CVD, ALD, or any combinations thereof. Channel structure 514 thereby extends vertically through memory stack 534 and the semiconductor layer including first and second semiconductor layers 511 and 530, stopping at first dielectric layer 505, according to some embodiments.

Figure 5H:
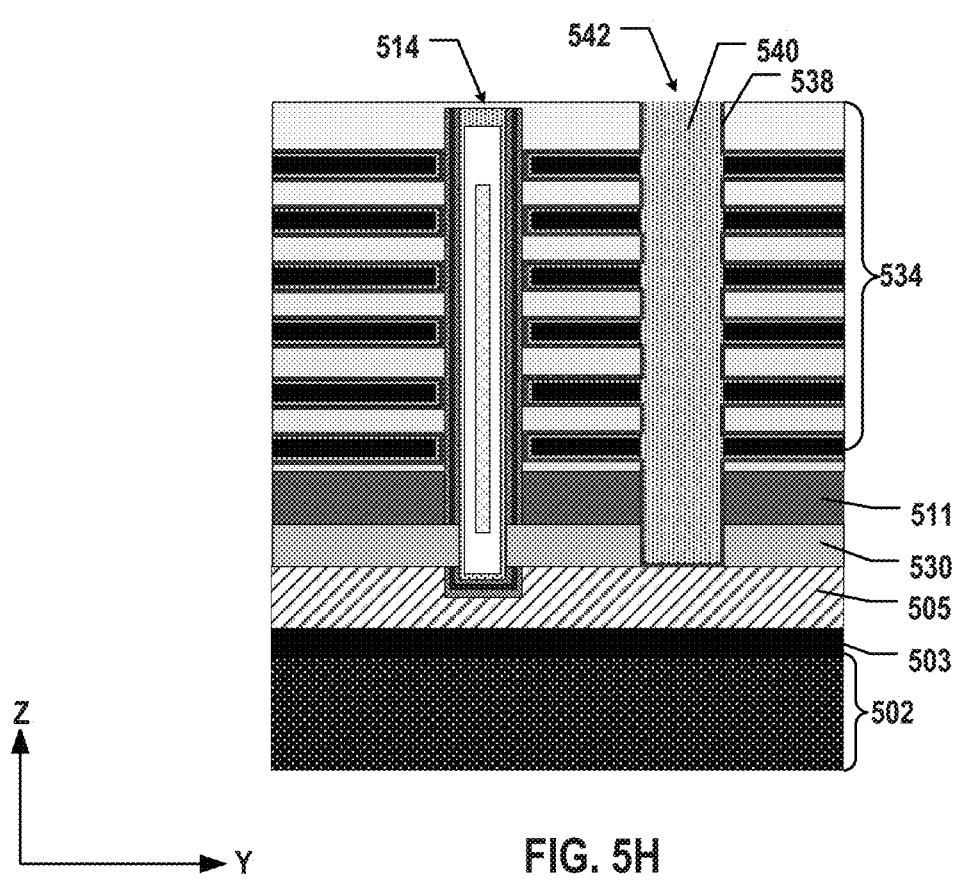

Method 600 proceeds to operation 612, as illustrated in FIG. 6, in which an insulating structure is formed in the opening. In some embodiments, to form the insulating structure, one or more dielectric materials are deposited into the opening to fill the opening. As illustrated in FIG. 5H, an insulating structure 542 is formed in slit 524 (shown in FIG. 5G). Insulating structure 542 can be formed by depositing one or more dielectric materials, such as high-k dielectrics (also as a gate dielectric layer 538) and silicon oxide as an insulating core 540, in slit 524 to completely or partially fill slit 524 with or without air gap using one or more thin film deposition processes, such as PVD, CVD, ALD, or any combinations thereof.

Figure 5I:
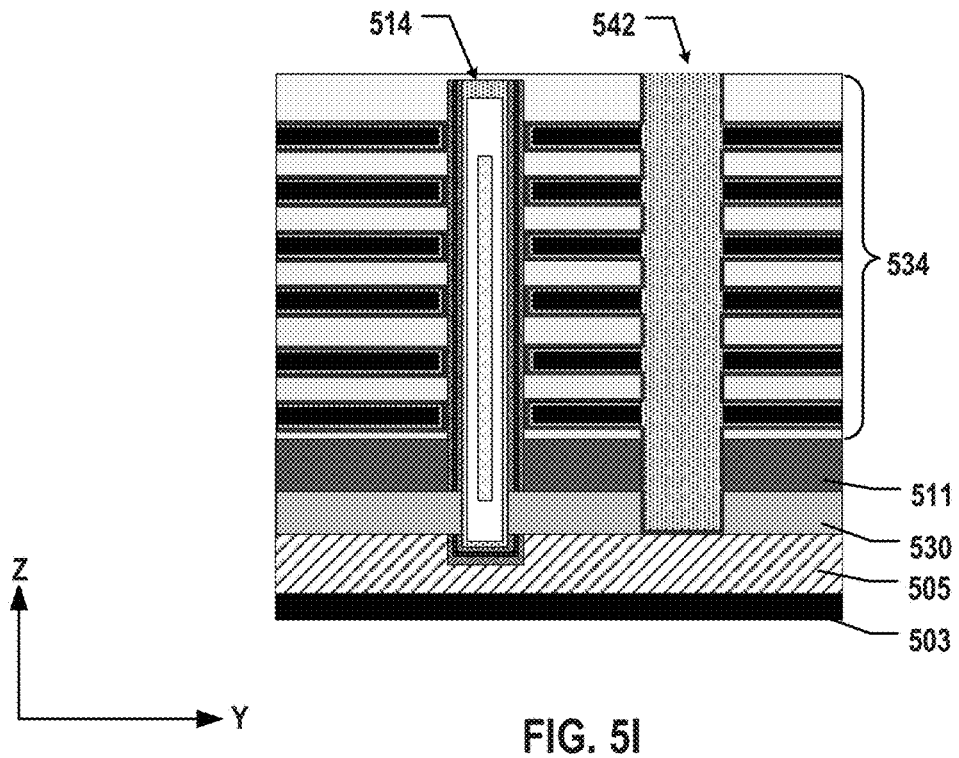
Figure 5J:
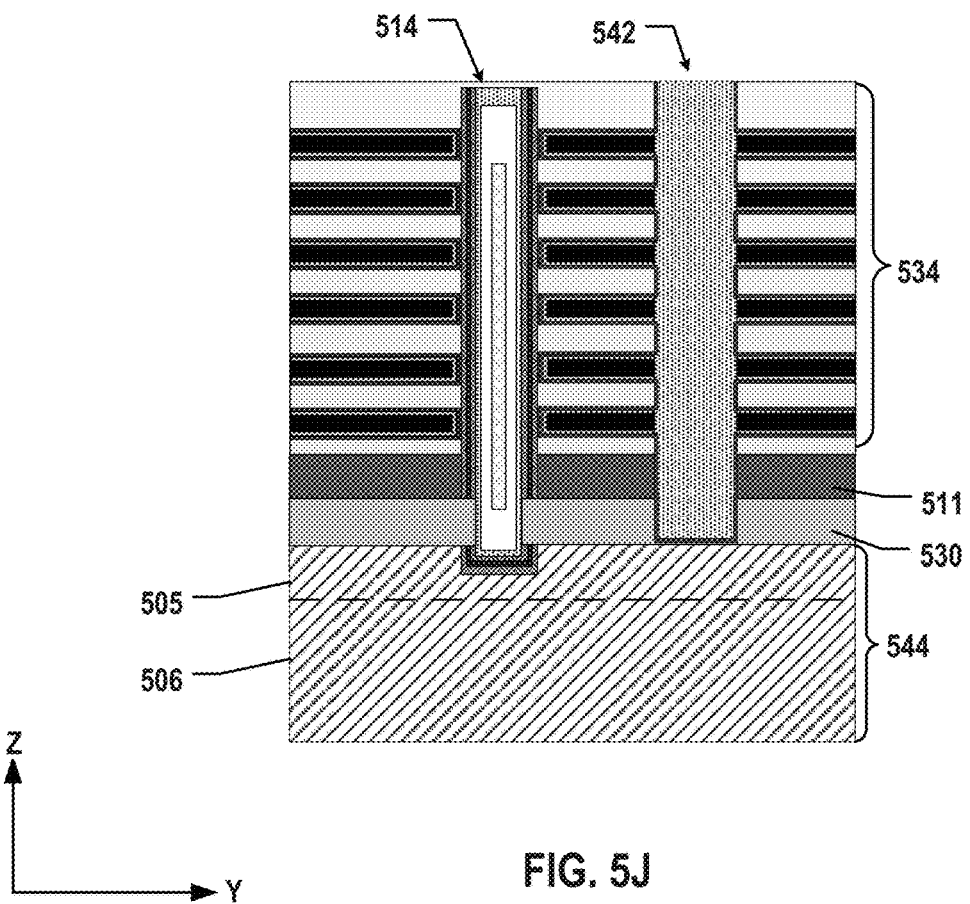

Method 600 proceeds to operation 614, as illustrated in FIG. 6, in which the substrate is removed, from a second side opposite to the first side of the substrate, stopping at the stop layer. The second side can be the backside of the substrate. As illustrated in FIG. 5I, substrate 502 (shown in FIG. 5H) is removed from the backside. Although not shown in FIG. 5I, it is understood that the intermediate structure in FIG. 5H may be flipped upside down to have substrate 502 on the top of the intermediate structure. In some embodiments, substrate 502 is completely removed using CMP, grinding, wet etching, and/or dry etching until being stopped by stop layer 503 (e.g., a silicon nitride layer). In some embodiments, substrate 502 (a silicon substrate) is removed using silicon CMP, which is automatically stopped when reaching stop layer 503 having materials other than silicon, i.e., acting as a backside CMP stop layer. In some embodiments, substrate 502 (a silicon substrate) is removed using wet etching by TMAH, which is automatically stopped when reaching stop layer 503 having materials other than silicon, i.e., acting as a backside etch stop layer. Nevertheless, stop layer 503 can ensure the complete removal of substrate 502 without the concern of thickness uniformity after thinning Method 600 proceeds to operation 616, as illustrated in FIG. 6, in which a source contact structure extending vertically through the dielectric layer, stopping at the semiconductor layer is formed. The source contact structure is in contact with the second semiconductor layer. As illustrated in FIG. 5J, stop layer 503 is removed using wet etching and/or dry etching to expose first dielectric layer 505. A second dielectric layer (i.e., a second insulating layer) 506 can be formed on the second side of first dielectric layer 505 by depositing dielectric materials, such as silicon oxide, on top of first dielectric layer 505 using one or more thin film deposition processes, such as PVD, CVD, ALD, or any combinations thereof. In some embodiments, the interfaces between first and second dielectric layers 505 and 506 may become indistinguishable as each of first and second dielectric layers 505 and 506 includes the same dielectric materials, such as silicon oxide. Thus, first and second dielectric layers 505 and 506 may be collectively viewed as a dielectric layer (i.e., an insulating layer) 544 after the deposition.

Figure 5K:
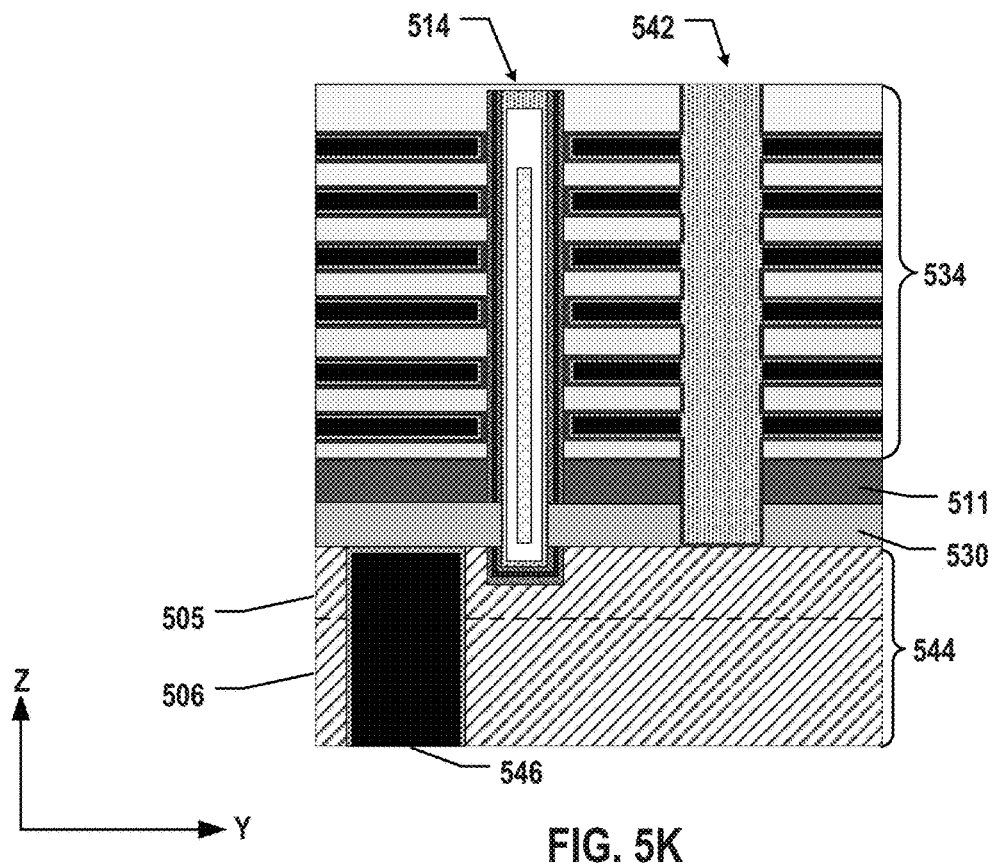

In some embodiments, as illustrated in FIG. 5K, a backside source contact structure 546 is formed extending vertically through dielectric layer 544 to be in contact with second semiconductor layer 530. Source contact structure 546 is spaced apart laterally from channel structure 514 in first dielectric layer 505 of dielectric layer 544. In some embodiments, source contact structure 546 is formed by first etching an opening extending vertically through dielectric layer 544 into second semiconductor layer 530 using wet etching and/or dry etching, such as RIE, followed by forming an adhesion layer over the sidewall and the bottom surface of the opening, for example, by depositing TiN using one or more thin film deposition processes, such as PVD, CVD, ALD, or any combinations thereof. Source contact structure 546 then can be formed by forming a conductive layer over the adhesion layer, for example, by depositing a metal (e.g., W) using one or more thin film deposition processes, such as PVD, CVD, ALD, electroplating, electroless plating, or any combinations thereof.

Figure 5L:
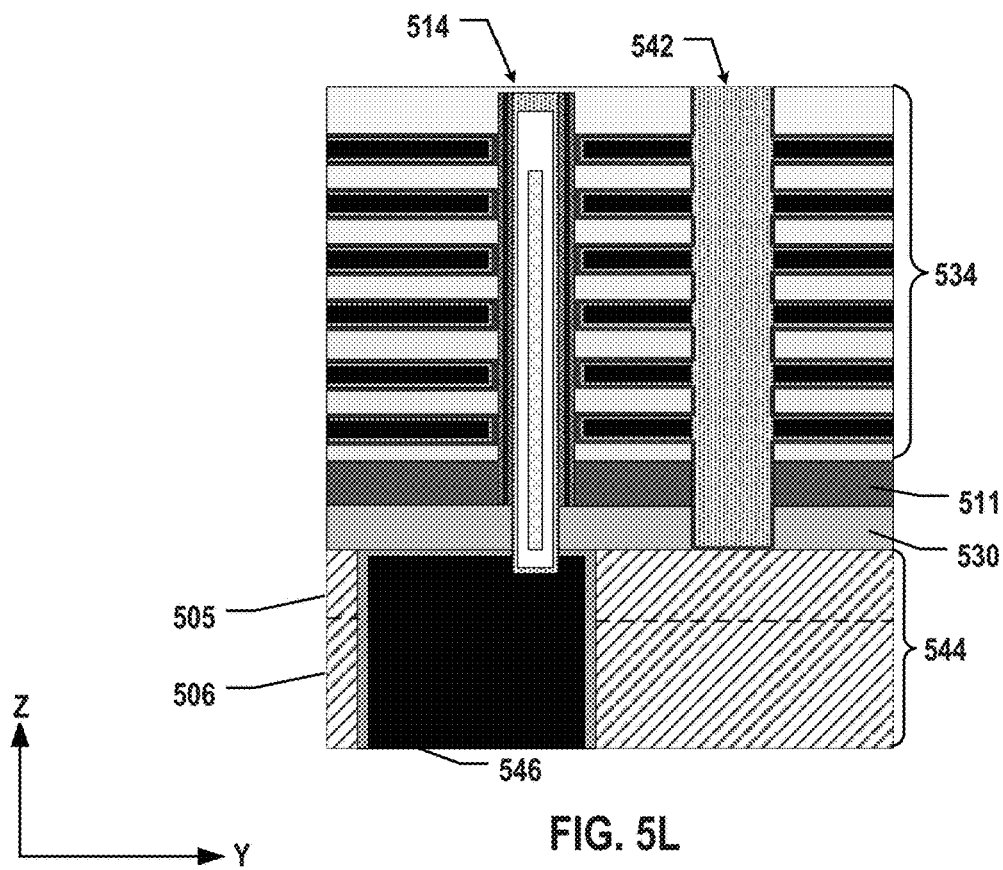

In some embodiments, as illustrated in FIG. 5L, source contact structure 546 is formed extending vertically through dielectric layer 544 to be in contact with second semiconductor layer 530 as well as in contact with part of channel structure 514 abutting first dielectric layer 505 of dielectric layer 544.

For example, source contact structure 546 is formed by first etching an opening extending vertically through dielectric layer 544 into second semiconductor layer 530. Source contact structure 546 is also formed by removing part of memory film 516 abutting dielectric layer 505 to expose part of semiconductor channel 518 abutting dielectric layer 505 to be in contact with source contact structure 546. In some embodiments, when etching the part of memory film 516, parts of the blocking layer (e.g., including silicon oxide), storage layer (e.g., including silicon nitride), and tunneling layer (e.g., including silicon oxide) are etched by applying etchants through the opening for forming source contact structure 546, for example, phosphoric acid for etching silicon nitride and hydrofluoric acid for etching silicon oxide. The etching can be stopped by semiconductor channel 518. That is, the removal of part of memory film 516 within first dielectric layer 505 does not affect semiconductor channel 518 including polysilicon and capping layer 520 enclosed by semiconductor channel 518, according to some embodiments. The remaining part of semiconductor channel 518 can thus act as the stop layer to prevent any further etching of channel structure 514.

According to one aspect of the present disclosure, a 3D memory device an insulating layer, a semiconductor layer, a memory stack including interleaved conductive layers and dielectric layers, a source contact structure extending vertically through the insulating layer from an opposite side of the insulating layer with respect to the semiconductor layer to be in contact with the semiconductor layer, and a channel structure extending vertically through the memory stack and the semiconductor layer into the insulating layer or the source contact structure.

In some embodiments, the channel structure extends vertically into the insulating layer and is spaced apart from the source contact laterally in the insulating layer.

In some embodiments, the channel structure extends vertically into the source contact structure.

In some embodiments, the 3D memory device further includes an insulating structure extending vertically through the memory stack into the semiconductor layer.

In some embodiments, at least part of a bottom surface of the insulating structure is flush with a top surface of the insulating layer.

In some embodiments, the channel structure includes a memory film and a semiconductor channel, and part of the semiconductor channel along a sidewall of the channel structure is in contact with a sublayer of the semiconductor layer.

In some embodiments, the semiconductor layer comprises polysilicon.

In some embodiments, the semiconductor layer includes an N-type doped polysilicon layer.

According to another aspect of the present disclosure, a 3D memory device includes an insulating layer, a semiconductor layer, a memory including interleaved conductive layers, a channel structure extending vertically through the memory stack and the semiconductor layer, and an insulating structure extending vertically through the memory stack into the semiconductor layer. The channel structure includes a memory film and a semiconductor channel, and part of the semiconductor channel along a sidewall of the channel structure is in contact with a sublayer of the semiconductor layer. The 3D memory device also includes an insulating structure extending vertically through the memory stack into the semiconductor layer. A bottom surface of the insulating structure is flush with a top surface of the insulating layer.

In some embodiments, the 3D memory device further includes a source contact structure extending vertically through the insulating layer from the opposite side of the insulating layer with respect to the semiconductor layer to be in contact with the semiconductor layer.

In some embodiments, the channel structure extends vertically into the insulating layer and is spaced apart from the source contact structure in the insulating layer.

In some embodiments, the channel structure extends vertically into the source contact structure.

In some embodiments, the semiconductor layer comprises polysilicon.

In some embodiments, the semiconductor layer includes an N-type doped polysilicon layer.

According to still another aspect of the present disclosure, a method for forming a 3D memory device is disclosed. A stop layer, a first insulating layer, a sacrificial layer, a first semiconductor layer, and a dielectric stack are sequentially formed at a first side of a substrate. A channel structure is formed extending vertically through the dielectric stack, the first semiconductor layer, and the sacrificial layer into the first insulating layer. An opening extending is formed vertically through the dielectric stack and the first semiconductor layer, stopping at the sacrificial layer to expose part of the sacrificial layer. The sacrificial layer is replaced through the opening with a second semiconductor layer between the first semiconductor layer and the first insulating layer. The substrate is removed from a second side opposite to the first side of the substrate, stopping at the stop layer.

In some embodiments, to form the channel structure, a channel hole extending vertically through the dielectric stack, the first semiconductor layer, and the sacrificial layer into the first insulating layer is formed, and a memory film and a semiconductor channel along a sidewall of the channel hole are sequentially formed.

In some embodiments, the stop layer is removed, a second insulating layer in contact with the first insulating layer, and a source contact structure extending vertically through the first and second insulating layers to be in contact with the second semiconductor layer is formed.

In some embodiments, the source contact structure is spaced apart from the channel structure in the first insulating layer.

In some embodiments, to form the source contact structure, a portion of the memory film of the channel structure in the first insulating layer is removed, stopping at the semiconductor channel of the channel structure.

In some embodiments, the stop layer includes silicon nitride, and the first insulating layer includes silicon oxide.

In some embodiments, to form the sacrificial layer, a first sacrificial layer and a second sacrificial layer are sequentially formed, and forming the opening is stopped at the second sacrificial layer.

In some embodiments, the first sacrificial layer includes polysilicon, and the second sacrificial layer includes silicon oxynitride.

In some embodiments, to replace the sacrificial layer with the second semiconductor layer, the sacrificial layer is removed through the opening to form a cavity between the first semiconductor layer and the first insulating layer. Part of the memory film is removed through the opening to expose part of the semiconductor channel along the sidewall of the channel hole, and polysilicon is deposed through the opening into the cavity to form the second semiconductor layer.

In some embodiments, at least one of the first and second semiconductor layers is doped with an N-type dopant. The N-type dopant is diffused in the first and second semiconductor layers.

In some embodiments, prior to removing the substrate, an insulating structure is formed in the opening. The insulating structure is in contact with the first insulating layer.

According to yet another aspect of the present disclosure, a method for forming a 3D memory device is disclosed. A first insulating layer, a sacrificial layer, a first semiconductor layer, and a dielectric stack are sequentially formed on a substrate. A channel structure is formed extending vertically through the dielectric stack, the first semiconductor layer, and the sacrificial layer into the first insulating layer. The sacrificial layer is replaced with a second semiconductor layer between the first semiconductor layer and the first insulating layer. At least one of the first and second semiconductor layers is doped with an N-type dopant. The N-type dopant is diffused in the first and second semiconductor layers.

In some embodiments, prior to replacing the sacrificial layer with the second semiconductor layer, an opening extending vertically through the dielectric stack and the first semiconductor layer, stopping at the sacrificial layer to expose part of the sacrificial layer is formed, such that the sacrificial layer is replaced with the second semiconductor layer through the opening.

In some embodiments, to form the channel structure, a channel hole extending vertically through the dielectric stack, the first semiconductor layer, and the sacrificial layer, into the first insulating layer is formed. A memory film and a semiconductor channel along a sidewall of the channel hole are sequentially formed.

In some embodiments, a stop layer between the substrate and the first insulating layer is formed. The substrate is removed from an opposite side of the substrate with respect to the stop layer, stopping at the stop layer.

In some embodiments, after removing the substrate, the stop layer is removed, and a second insulating layer in contact with the first insulating layer is formed. A source contact structure extending vertically through the first and second insulating layers to be in contact with the second semiconductor layer is formed.

In some embodiments, the source contact structure is spaced apart from the channel structure in the first insulating layer.

In some embodiments, to form the source contact structure, a portion of the memory film of the channel structure in the first insulating layer is removed, stopping at the semiconductor channel of the channel structure.

In some embodiments, prior to removing the substrate, an insulating structure is formed in the opening through the second semiconductor layer. The insulating structure is in contact with the first insulating layer.

In some embodiments, the stop layer includes silicon nitride.

In some embodiments, to form the sacrificial layer, a first sacrificial layer and a second sacrificial layer are sequentially formed. The opening is formed, stopped at the second sacrificial layer.

In some embodiments, the first sacrificial layer comprises polysilicon or silicon nitride, and the second sacrificial layer comprises silicon oxynitride.

In some embodiments, to replace the sacrificial layer with the second semiconductor layer, the sacrificial layer is removed through the opening to form a cavity between the first semiconductor layer and the first insulating layer. Part of the memory film is removed through the opening to expose part of the semiconductor channel along the sidewall of the channel hole. Polysilicon is deposited through the opening into the cavity to form the second semiconductor layer.

In some embodiments, each of the first and second semiconductor layer comprises polysilicon.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   an insulating layer;
   a semiconductor layer;
   a memory stack comprising interleaved conductive layers and dielectric layers;
   a source contact structure extending vertically through the insulating layer from an opposite side of the insulating layer with respect to the semiconductor layer to be in contact with the semiconductor layer; and
   a channel structure extending vertically through the memory stack and the semiconductor layer into the insulating layer or the source contact structure.

2. The 3D memory device of claim 1, wherein the channel structure extends vertically into the insulating layer and is spaced apart from the source contact structure laterally in the insulating layer.

3. The 3D memory device of claim 1, wherein the channel structure extends vertically into the source contact structure.

4. The 3D memory device of claim 1, further comprising an insulating structure extending vertically through the memory stack into the semiconductor layer.

5. The 3D memory device of claim 4, wherein a bottom surface of the insulating structure is flush with a top surface of the insulating layer.

6. The 3D memory device of claim 1, wherein the channel structure comprises a memory film and a semiconductor channel, and part of the semiconductor channel along a sidewall of the channel structure is in contact a sublayer of the semiconductor layer.

7. The 3D memory device of claim 1, wherein the semiconductor layer comprises polysilicon.

8. A three-dimensional (3D) memory device, comprising:
   an insulating layer;
   a semiconductor layer;
   a memory stack comprising interleaved conductive layers and dielectric layers;
   a channel structure extending vertically through the memory stack and the semiconductor layer, wherein the channel structure comprises a memory film and a semiconductor channel, and part of the semiconductor channel along a sidewall of the channel structure is in contact with a sublayer of the semiconductor layer; and
   an insulating structure extending vertically through the memory stack into the semiconductor layer, wherein a bottom surface of the insulating structure is flush with a top surface of the insulating layer.

9. The 3D memory device of claim 8, further comprising a source contact structure extending vertically through the insulating layer from an opposite side of the insulating layer with respect to the semiconductor layer to be in contact with the semiconductor layer.

10. The 3D memory device of claim 9, wherein the channel structure extends vertically into the insulating layer and is spaced apart from the source contact structure laterally in the insulating layer.

11. The 3D memory device of claim 9, wherein the channel structure extends vertically into the source contact structure.

12. The 3D memory device of claim 8, further comprising an insulating structure extending vertically through the memory stack into the semiconductor layer, wherein a bottom surface of the insulating structure is flush with a top surface of the insulating layer.

13. The 3D memory device of claim 8, wherein the semiconductor layer comprises polysilicon.

14. A memory device, comprising:
    a semiconductor layer;
    a memory stack comprising interleaved conductive layers and dielectric layers on a first side of the semiconductor layer;
    a source contact structure on a second side of the semiconductor layer opposite to the first side; and
    a channel structure extending vertically through the memory stack and the semiconductor layer into the source contact structure.

15. The memory device of claim 14, further comprising:
    an insulating layer on the second side of the semiconductor layer;
    wherein the source contact structure vertically penetrates the insulating layer and is in contact with the semiconductor layer.

16. The memory device of claim 14, further comprising:
    an insulating structure extending vertically through the memory stack into the semiconductor layer and extending laterally to separate the memory stack into memory fingers, wherein a bottom surface of the insulating structure is flush with a surface of the semiconductor layer.

17. The memory device of claim 16, further comprising:
    a support structure extending vertically through the memory stack into the semiconductor layer and in contact with the insulating structure.

18. The memory device of claim 17, further comprising:
    an overlapped portion of the insulating structure and the support structure embedded in the semiconductor layer.

19. The memory device of claim 14, wherein:
    the channel structure comprises a memory film and a semiconductor channel, and
    a sidewall of the semiconductor channel is in contact with the semiconductor layer and the source contact structure.

20. The memory device of claim 19, wherein the semiconductor layer comprises:
    a first semiconductor sublayer in contact with a sidewall of the memory film without in contact with the semiconductor channel and the source contact structure; and
    a second semiconductor sublayer in contact with the semiconductor channel and the source contact structure.

* * * * *